US009221624B2

(12) United States Patent
Yamagata et al.

(10) Patent No.: US 9,221,624 B2
(45) Date of Patent: Dec. 29, 2015

(54) PARTS FEEDING DEVICE, PARTS MOUNTING DEVICE AND PARTS FEEDING METHOD

(71) Applicant: YAMAHA HATSUDOKI KABUSHIKI KAISHA, Shizuoka-ken (JP)

(72) Inventors: Hirotoshi Yamagata, Shizuoka (JP); Toshimichi Satou, Shizuoka (JP); Atsushi Okada, Shizuoka (JP); Akira Kishida, Shizuoka (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 185 days.

(21) Appl. No.: 13/893,023

(22) Filed: May 13, 2013

(65) Prior Publication Data
US 2013/0309049 A1 Nov. 21, 2013

(30) Foreign Application Priority Data

May 17, 2012 (JP) .................. 2012-113461

(51) Int. Cl.
B65G 1/06 (2006.01)
B65G 49/00 (2006.01)
H05K 13/04 (2006.01)
H05K 13/02 (2006.01)

(52) U.S. Cl.
CPC .............. *B65G 49/00* (2013.01); *H05K 13/021* (2013.01); *H05K 13/0434* (2013.01)

(58) Field of Classification Search
CPC ... H05K 13/021; H05K 13/0434; B65G 49/00

USPC .............. 414/222.01, 331.1, 331.11, 331.12, 414/416.01
See application file for complete search history.

(56) References Cited

U.S. PATENT DOCUMENTS

| 4,032,027 | A | * | 6/1977 | Lindberg ...................... 414/400 |
| 4,277,216 | A | * | 7/1981 | Lindberg ................. 414/331.09 |
| 4,950,120 | A | * | 8/1990 | Barnes ..................... 414/331.12 |
| 5,645,392 | A | * | 7/1997 | Leichty et al. ........... 414/416.01 |
| 5,816,798 | A |  | 10/1998 | Strohmaier |
| 5,868,545 | A | * | 2/1999 | Kasai et al. ................... 414/808 |
| 6,036,425 | A | * | 3/2000 | Seto ............................. 414/277 |
| 6,199,272 | B1 | * | 3/2001 | Seto et al. ....................... 29/740 |
| 6,241,459 | B1 | * | 6/2001 | Canella et al. ............. 414/798.1 |
| 6,524,052 | B1 | * | 2/2003 | Yamauchi et al. ......... 414/331.1 |
| 2006/0169412 | A1 | * | 8/2006 | Terui et al. ................... 156/349 |
| 2010/0256801 | A1 | * | 10/2010 | Ohno ........................... 700/218 |

FOREIGN PATENT DOCUMENTS

| DE | 19619486 A1 | 12/1997 |
| JP | 2001-024386 A | 1/2001 |
| WO | 02/19788 A1 | 3/2002 |

OTHER PUBLICATIONS

The extended European search report issued on Jan. 23, 2014, which corresponds to European Patent Application No. 13002581.0-1803 and is related to U.S. Appl. No. 13/893,023.

* cited by examiner

*Primary Examiner* — Kaitlin Joerger
(74) *Attorney, Agent, or Firm* — Studebaker & Brackett PC

(57) ABSTRACT

A parts feeding device includes a magazine for housing pallets, a parts feeding table capable of supporting a plurality of pallets in a state where a tray mounted on a topmost pallet is positioned within a movable range of a parts retrieving head and in a state where an upside of the tray is open, and a relay device which inserts and removes the pallets into and from the magazine and the parts feeding table.

9 Claims, 14 Drawing Sheets

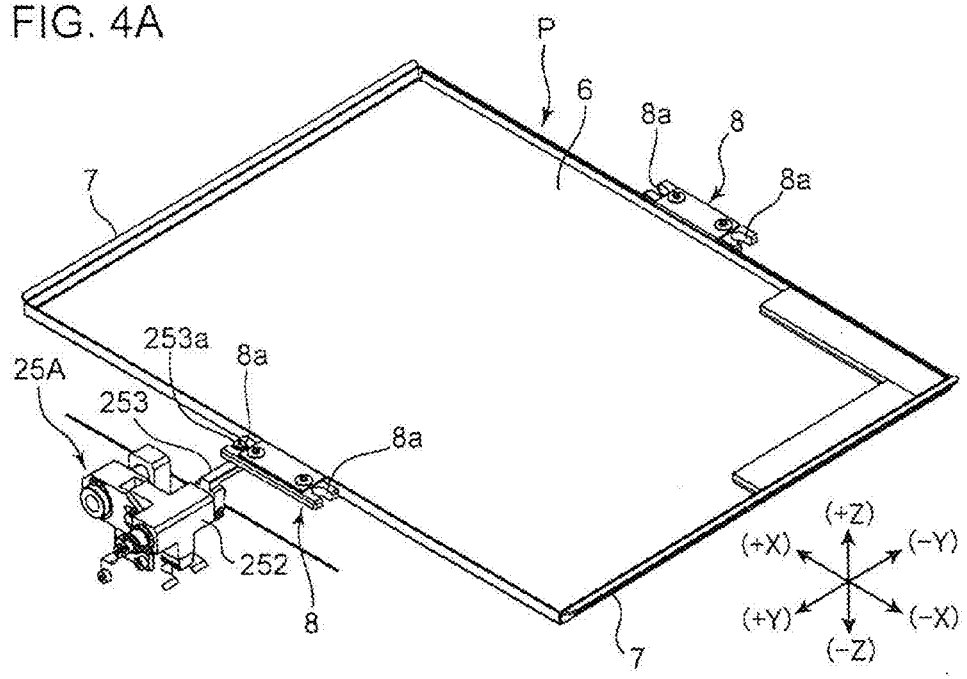
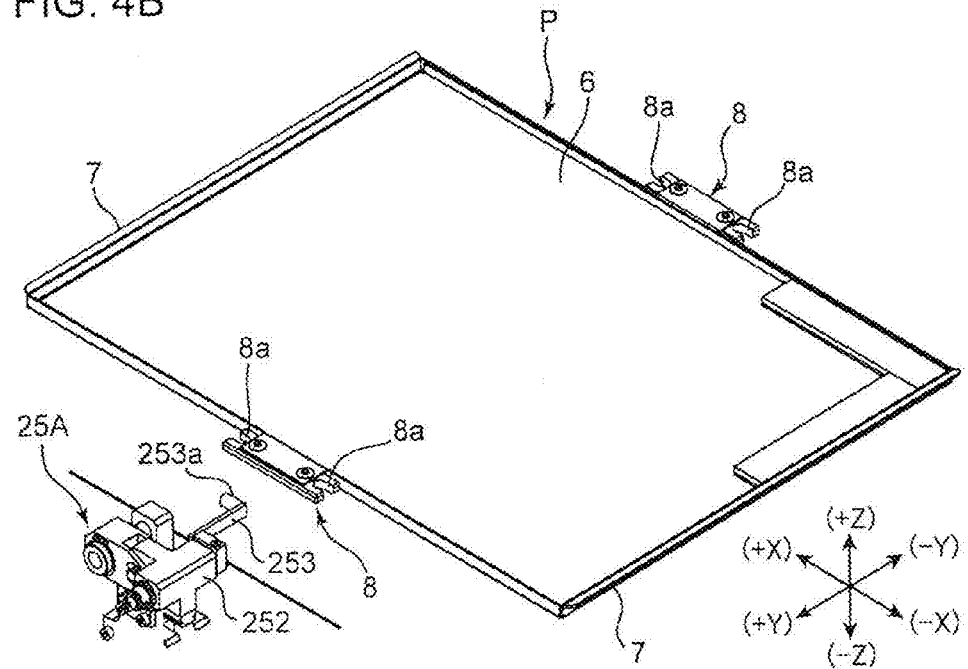

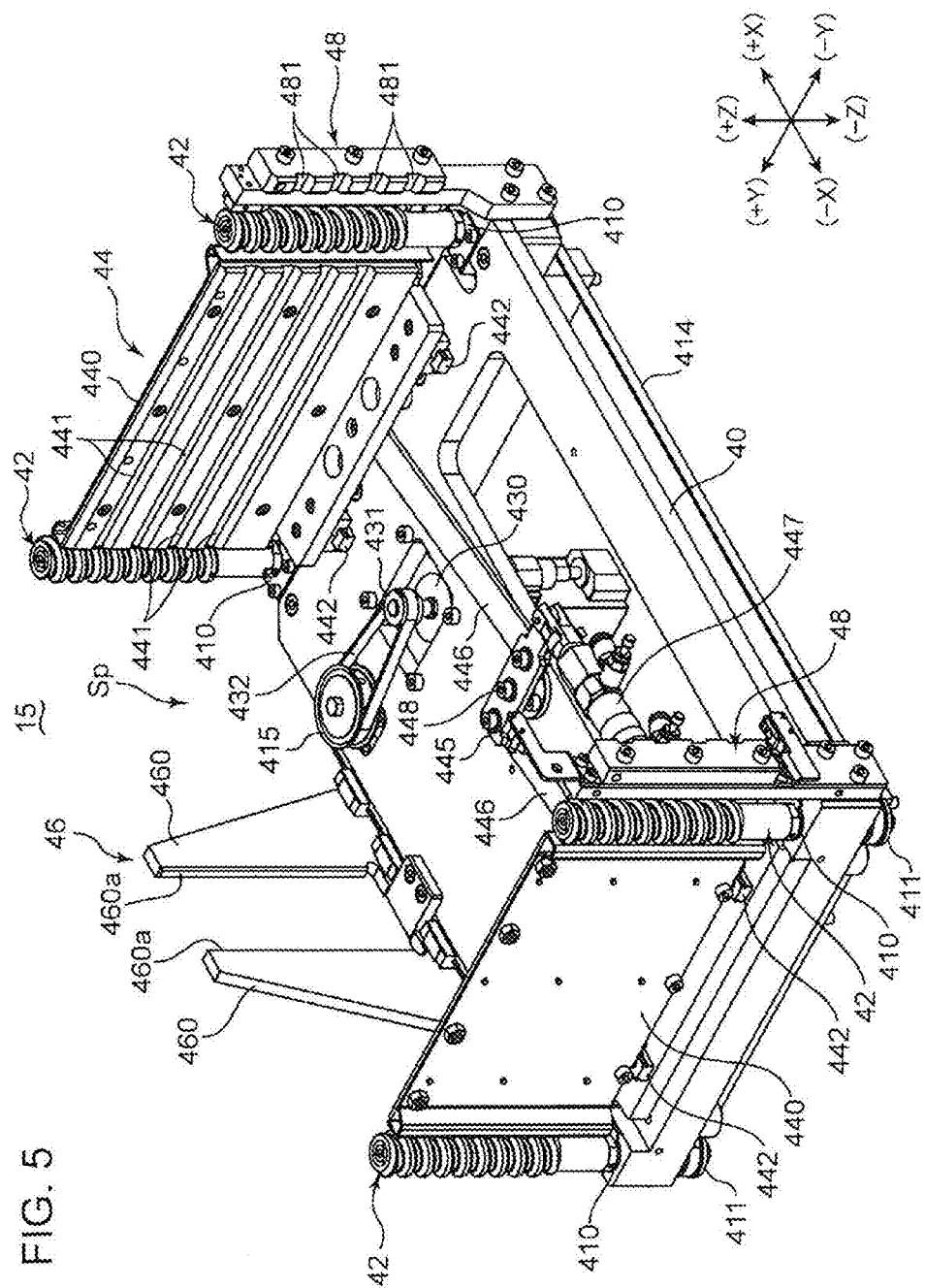

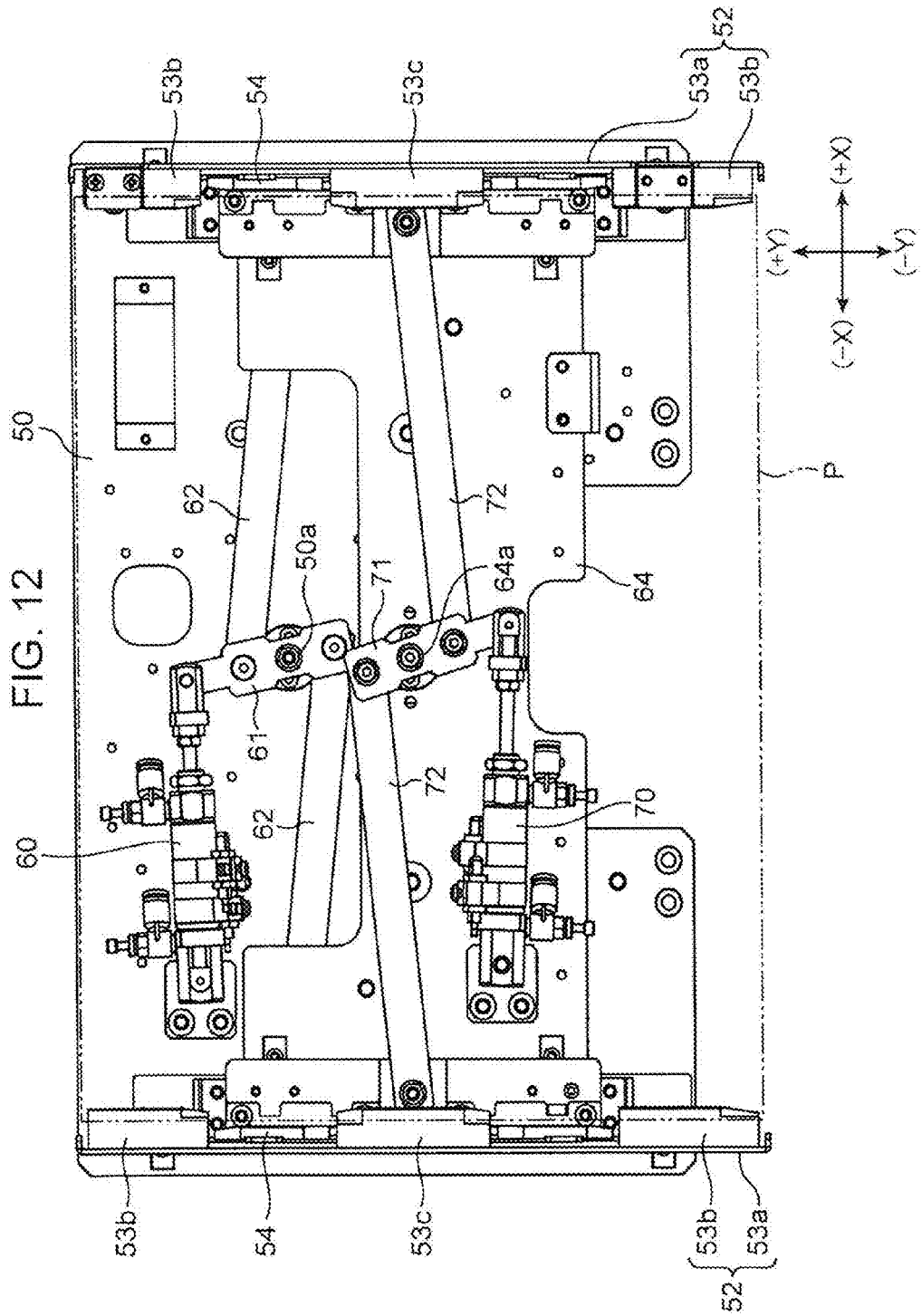

PARTS FEEDING DEVICE, PARTS MOUNTING DEVICE AND PARTS FEEDING METHOD

BACKGROUND OF THE INVENTION

1. Field of the Invention

The present invention relates to a parts feeding device for feeding parts to a parts mounting device.

2. Background Art

As a parts feeding device for feeding parts to a parts mounting device, conventionally, known is the type disclosed in Japanese Patent Application Publication No. 2001-24386 ("Patent Document"). The parts feeding device disclosed in this patent document is used in a state of being equipped to the parts mounting device, and feeds quad flat package (QFP) and other package-type electronic parts (hereinafter simply referred to as the "parts") in a state where the parts are housed in a tray.

This parts feeding device comprises a magazine housing, in a plurality of upper and lower levels, pallets each having the tray mounted thereon, and a retrieval portion which is provided movably in a vertical direction at a position in front of the magazine, and retrieves the pallets from the magazine and retains the pallets.

With this parts feeding device, parts are fed as follows. Foremost, the retrieval portion moves to the position of the pallet on which the intended tray is mounted, and retrieves the pallet, together with the tray, from the magazine, and retains the pallet. Subsequently, by the retrieval portion moving in the upward direction, the tray is disposed at a predetermined parts feeding position. More specifically, the head on the parts mounting device side disposes the tray at a predetermined height position (parts feeding position) which enables the retrieval of the parts. It is thereby possible to feed the parts on the tray to the parts mounting device. After the parts are fed, the retrieval portion performs the reverse operation of the operation described above, and returns the tray to its original position in the magazine. Note that, when there are no more parts on the tray as a result of all parts being fed, the tray is returned to its original position in the magazine, the retrieval portion retrieves a new tray (pallet) housing parts from the magazine and moves the new tray (pallet) in the upward direction so as to dispose the tray at the predetermined parts feeding position.

With the conventional parts feeding device, the head is unable to retrieve the parts (next parts) in the tray until the head on the parts mounting device side retrieves the parts, the tray of the parts feeding position is thereafter returned to the magazine, and a new tray is pulled out from the magazine and disposed at the parts feeding position. Thus, it is often the case that the head is subject to a standby time, and the parts feeding device was unable to contribute to an efficient mounting operation. In particular, in cases where the same parts are housed in one tray and different parts (different types of parts) are to be continuously fed, since the foregoing insertion/removal operation of the tray into and from the magazine is repeatedly performed, there was concern of deteriorating the mounting efficiency.

SUMMARY OF THE INVENTION

The present invention was devised in view of the foregoing circumstances, and an object of this invention is to provide technology for efficiently feeding the parts housed in a tray.

The parts feeding device according to one aspect of the present invention is a parts feeding device placed adjacent to a working device capable of retrieving parts housed in a tray using a head having a predetermined movable range, comprising a magazine which includes a plurality of pallets each having the tray mounted thereon, the pallets being housed in a state of being arranged in a vertical direction so as to be inserted and removed in a horizontal first direction, a parts feeding table which is placed opposite to the magazine in the first direction, and which can support the pallets that are pulled out from the magazine, and a relay device which is provided movably in a vertical direction at a position between the magazine and the parts feeding table, and which delivers the pallets in the first direction between the magazine and the parts feeding table, wherein the parts feeding table supports the pallets in a state where the plurality of pallets are arranged in the vertical direction, and in a state where a tray mounted on a topmost pallet, among the plurality of pallets, is positioned within the movable range of the head and an upside of the tray is open.

BRIEF DESCRIPTION OF THE DRAWINGS

FIG. 4A shows the pallet and the insertion/removal head in an engaged state, and FIG. 4B shows the pallet and the insertion/removal head in a non-engaged state;

FIG. 5 is a perspective view showing the parts feeding table provided to the parts feeding device;

FIG. 12 is a plan view showing the parts feeding table;

DETAILED DESCRIPTION OF THE PREFERRED EMBODIMENTS OF THE INVENTION

A preferred embodiment of the present invention is now explained in detail with reference to the appended drawings.

Figure 1:
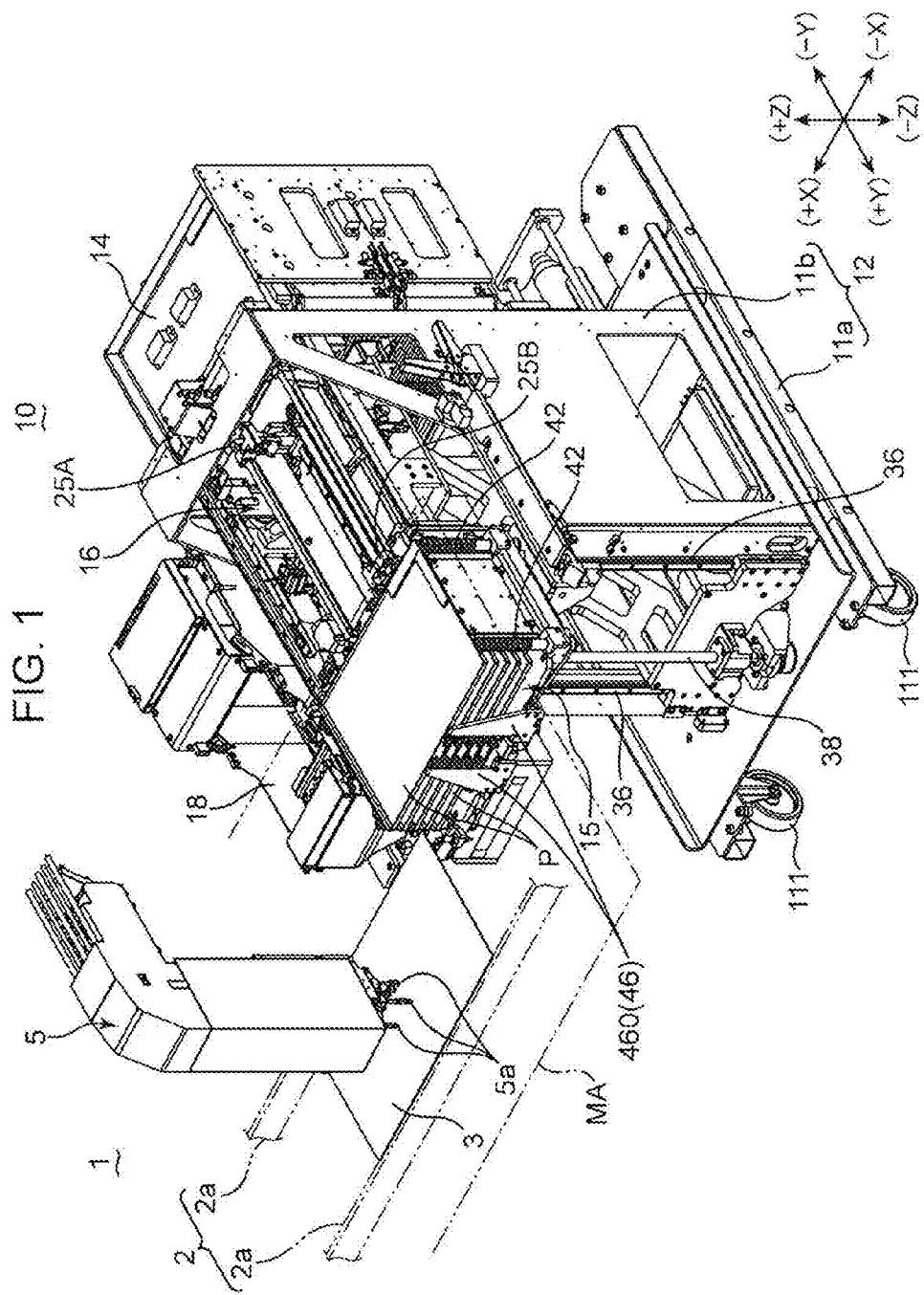
FIG. 1 is a perspective view showing the parts feeding device according to the present invention, and the parts mounting device (parts mounting device of the present invention) equipped with the parts feeding device.

FIG. 1 is a perspective view showing the parts feeding device according to the present invention. This diagram and the diagrams referred to subsequently show the XYZ rectangular coordinate axes for clarifying the directional relationship.

The parts feeding device 10 is used in a state of being placed adjacent to the parts mounting device 1 (an example of the working device of the present invention). In this diagram, only a part of the parts mounting device 1 is illustrated. The parts mounting device 1 comprises a substrate transport mechanism 2 configured from a pair of belt conveyers 2a extending in the X direction, a parts feeding unit for feeding parts to be mounted, and a head unit 5 which includes a plurality of elevatable heads 5a (movable in the Z direction) for mounting parts and can move in the XY direction, and the head 5a retrieves parts from the parts feeding unit and mounts the parts on a substrate 3 such as a printed wiring board (PWB) which is installed to and positioned at a predetermined work position by the substrate transport mechanism 2. The head 5a has a given movable range, and performs the retrieval of parts from the parts feeding unit and the mounting of parts on the substrate 3 within the movable range.

The parts feeding device 10 configures the parts feeding unit of the parts mounting device 1. The parts feeding device 10 is removably coupled to the rear side (−Y direction side) of the parts mounting device 1 for mainly feeding quad flat package (QFP) and other package-type parts. The configuration of the parts feeding device 10 is now explained in detail. Note that, with both the parts mounting device 1 and the parts feeding device 10, the +Y direction side shown in the diagram is the front side of the device, and the −Y direction side is the rear side of the device.

The parts feeding device 10 comprises, for instance, a frame 12, a magazine 14, a parts feeding table 15, a relay device 16, a tape feeding retaining portion 18, and an elevation drive mechanism of the relay device 16.

The frame 12 includes a substantially rectangular base 11a in a planar view comprising a transport wheel 111, and a substantially rectangular hollow column portion 11b in a cross sectional view which is erected at the substantial center of the base 11a.

The magazine 14 is affixed to the upper end and rear side (−Y direction side) of the hollow column portion 11b of the frame 12. The magazine 14 is a box-shaped member for housing a plurality of pallets P on which is mounted a tray housing parts, the plurality of pallets P being housed in a state of being arranged in a vertical direction (Z direction) so as to be inserted and removed in a front-back direction (Y direction/corresponds to the first direction of the present invention). The tray (not shown) is a rectangular plate-shaped member in a planar view including a plurality of parts housing concave portions opened upward and arranged in a matrix. The inside of the magazine 14 houses 20 to 30 pallets P in this embodiment.

The structure of the pallets P is now explained. The pallet P comprises, as shown in FIG. 4A, a rectangular plate-shaped main body portion 6 in a planar view comprising a peripheral wall portion, and a flange portion 7 extending from the top end of the peripheral wall portion toward the outside at either end of the main body portion 6 in the width direction (X direction). The pallet P is supported within the magazine 14 in a state of being retrievable to the front side of the device by the flange portion 7 being supported from the outside in the width direction. Moreover, the pallet P comprises engaged portions 8 respectively at both front and rear ends of the main body portion 6 and at the center in the width direction thereof. The engaged portions 8 couple the pallet P to the relay device 16 (insertion/removal heads 25A, 25B) upon inserting and removing the pallet P into and from the magazine 14 and the like, and semicircular notch portions 8a in a planar view respectively opening outward are formed at either end of the engaged portion 8 in the width direction. Note that the tray is mounted on the inner side of and along the peripheral wall portion of the main body portion 6 of the pallet P, and, for example, is fixed to the main body portion 6 with a fixing member such as a magnet.

The magazine 14 is provided with an opening for replacing parts on the rear face thereof (side face on the −Y direction side), and the pallet P is inserted into and removed from the rear face side of the magazine 14 via the opening upon replacing parts or supplementing parts. While not shown, the pallets P are housed in a predetermined case (not shown), for example, in units of 10 pallets P, and are retrievably supported within the magazine 14 via the case by being housed in the magazine 14. According to the foregoing configuration, a plurality of trays (parts) in the magazine 14 can be collectively replaced upon changing the substrate 3 using the parts mounting device 1.

The parts feeding table 15, as described in detail later, supports a plurality of pallets P in a state of being arranged in a vertical direction (Z direction). As shown in FIG. 1, the parts feeding table 15 is affixed to the top end and the front side (+Y direction side) of a hollow column portion 11b of the frame 12 so as to face the Y direction relative to the magazine 14. In addition, the relay device 16 is elevatably disposed (movable in the Z direction) at a position that is between the parts feeding table 15 and the magazine 14; that is, at a position on the inner side of the hollow column portion 11b of the frame 12 in a planer view.

Figure 2:
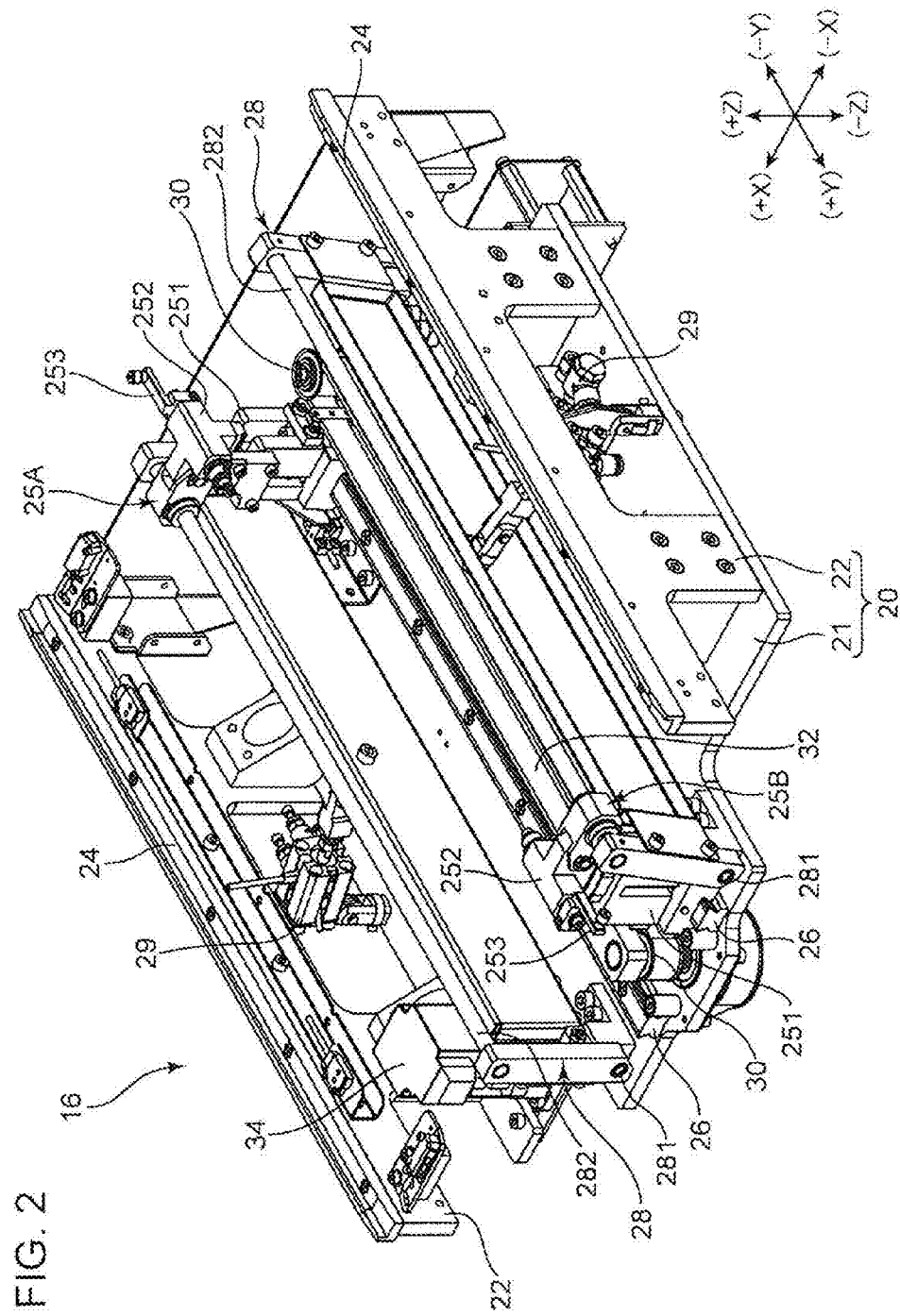
FIG. 2 is a perspective view showing the relay device provided to the parts feeding device.

The relay device 16 inserts and removes (delivers) the pallet P into and from the magazine 14 and the parts feeding table 15. As shown in FIG. 2, the relay device 16 includes a frame 20, two insertion/removal heads 25A, 25B (first insertion/removal head 25A, second insertion/removal head 25B), an insertion/removal head drive mechanism for moving the insertion/removal heads 25A, 25B in the front-back direction (Y direction), and an engaging portion drive mechanism for driving an engaging portion 253, described later, of the insertion/removal heads 25A, 25B.

The frame 20 includes a substantially rectangular base plate 21 in a planar view, and a pair of side walls 22 which is erected at either end of the base plate 21 in the width direction (X direction) and extends in the front-back direction. A guide portion 24 (corresponds to the guiding portion of the present invention) extending in the front-back direction is provided to the upper end of each side wall 22. The guide portions 24 guide the pallet P in the front-back direction. Each guide portion 24 has a cross section shape capable of supporting the flange portion 7 of the pallet P, and guiding the pallet P in the front-back direction while restraining the pallet P in the width direction (X direction). Surface treatment such as hard alumite treatment for reducing the coefficient of friction is given at least the sliding contact portion of the each guide portion 24.

The first and second insertion/removal heads 25A, 25B insert and remove the pallet P into and from the magazine 14 and the parts feeding table 15. In this example, the first insertion/removal head 25A performs the insertion and removal of the pallet P into and from the magazine 14, and the second insertion/removal head 25B performs the insertion and removal of the pallet P into and from the parts feeding table 15.

The insertion/removal heads 25A, 25B are provided to either end of the frame 20 with the middle in the width direction as the boundary. Each of the insertion/removal heads 25A, 25B is movably supported by a rail 26 which is fixed on the base plate 21 and extends in the Y direction.

The insertion/removal heads 25A, 25B respectively comprise a main body portion 251 to be movably mounted on the rail 26, and a moving portion 252 supported by the top portion of the main body portion 251 so as to be movable in the X direction relative to the main body portion 251.

An engaging portion 253 is provided to the moving portion 252. The engaging portion 253 couples the insertion/removal heads 25A, 25B with the pallet P upon inserting and removing the pallet P into and from the magazine 14.

Figure 3A:
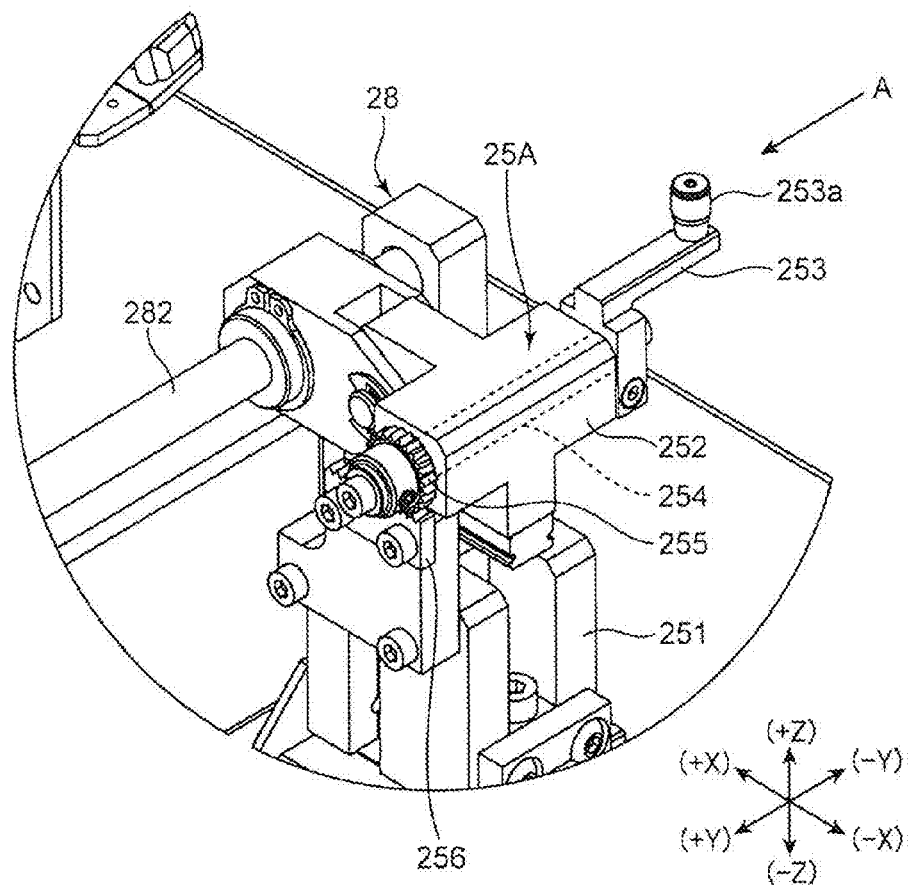
FIG. 3A is an enlarged view of the relevant part of FIG. 2 showing the relay device.
Figure 3B:
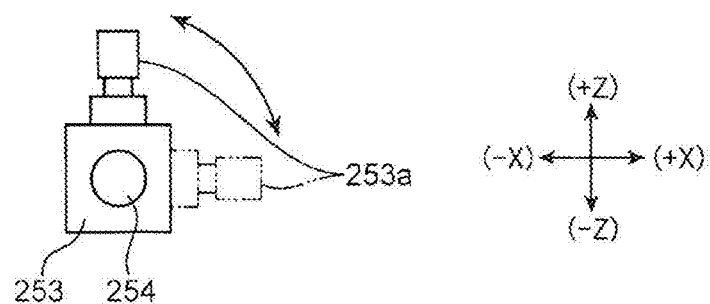
FIG. 3B is a schematic arrow view in the A direction of FIG. 3A.

As shown in FIGS. 3A, 3B, the engaging portion 253 comprises an engagement claw 253a having a shape that is engageable with the pallet P; specifically, a circular shaft shape in a cross section capable of engaging with the notch portion 8a of the engaged portion 8. The engaging portion 253 can be displaced between a position that is engageable with the pallet P, and a position of retracting below the pallet P. Specifically, the engaging portion 253 is provided tiltably between an actuated position (position shown with a solid line in the diagram) in which the engagement claw 253a protrudes upward from the moving portion 252, and a retracted position (position shown with a dashed-two dotted line in FIG. 3B) in which the engagement claw 253a collapses sideways relative to the moving portion 252, and driven by the engaging portion drive mechanism. More specifically, a support shaft 254 extending in the Y direction is rotatably supported by the moving portion 252 around its axis. The engaging portion 253 is fixed to an end on one side of the support shaft 254, and a pinion 255 is fixed to an end on the other side. In addition, the rack 256 is fixed to the main body portion 251, and the pinion 255 is engaged with the rack 256. According to the foregoing configuration, when the moving portion 252 moves in the X direction relative to the main body portion 251, the pinion 255, the support shaft 254 and the engaging portion 253 rotate integrally pursuant to the movement of the moving portion 252, and the engaging portion 253 is consequently displaced between the actuated position and the retracted position. In a state where the engaging portion 253 is disposed at the actuated position, as shown in FIG. 4A, while the engagement claw 253a becomes engageable with the engaged portion 8 (notch portion 8a) of the pallet P, in a state where the engaging portion 253 is disposed at the retracted position, as shown in FIG. 4B, the foregoing engaged state is released.

The engaging portion drive mechanism displaces the engaging portion 253 between the actuated position and the retracted position by driving the moving portion 252 forward and backward. As shown in FIG. 2, the engagement drive mechanism includes an oscillating member 28 which is disposed on the outer side of the insertion/removal heads 25A, 25B in the X direction and oscillatably supported on the base plate 21 (frame 20) via a support shaft 281 that is parallel to the Y direction, and an air cylinder 29 which is coupled to the oscillating member 28 and causes the oscillating member 28 to oscillate according to the switching of feeding and discharging of the air pressure. The oscillating member 28 comprises a guide shaft 282 extending in the Y direction, and the moving portion 252 of the respective insertion/removal heads 25A, 25B is movably mounted on the guide shaft 282 via a bearing or the like. In other words, the engaging portion drive mechanism causes the oscillating member 28 to oscillate around the support shaft 281 based on operation of the air cylinder 29, and moves the moving portion 252 in the X direction via the guide shaft 282 pursuant to the oscillation of the oscillating member 28.

The respective insertion/removal heads 25A, 25B move in mutually opposite directions along the rail 26 based on the insertion/removal head drive mechanism. The insertion/removal head drive mechanism includes a pair of pulleys 30 which are rotatably supported at a position between the rails 26 on base plate 21 and at either end in the Y direction, respectively, an endless drive belt 32 which is placed across the pulleys 30, a motor 34, and a transmission mechanism for transmitting the rotational drive force of the motor 34 to one pulley 30 of the pulleys 30. The main body portion 251 of the insertion/removal heads 25A, 25B is coupled (fixed) to the drive belt 32, respectively. In other words, the insertion/removal head drive mechanism moves the drive belt 32 in the peripheral direction using the motor 34, and moves the insertion/removal heads 25A, 25B respectively in mutually opposite directions along the rail 26 and the guide shaft 282 pursuant to the movement of the drive belt 32.

Note that the respective insertion/removal heads 25A, 25B have a mutually symmetrical configuration as shown in FIG. 2. In other words, the respective insertion/removal heads 25A, 25B are configured so that the engagement claws 253a mutually face outward in the width direction (X direction) of the frame 20 in a state where the engaging portion 253 is positioned outside the frame 20 in the front-back direction (Y direction) and the engaging portion 253 is set at a retracted position. Moreover, the respective insertion/removal heads 25A, 25B are coupled to the belt 32 so that, when the first insertion/removal head 25A is positioned at an end on one side of the frame 20 in the front-back direction, the second insertion/removal head 25B is positioned at an end on the other side of the frame 20.

According to the foregoing configuration, as described in detail later, the relay device 16 inserts and removes the pallet P into and from the magazine 14 by moving the first insertion/removal head 25A in the Y direction in a state where the engaging portion 253 of the first insertion/removal head 25A is engaged with the engaged portion 8 (corresponds to the first engaged portion of the present invention) on the front side (+Y direction side) of the pallet P, and inserts and removes the pallet P into and from the parts feeding table 15 by moving the second insertion/removal head 25B in the Y direction in a state where the engaging portion 253 of the second insertion/removal head 25B is engaged with the engaged portion 8 (corresponds to the second engaged portion of the present invention) on the rear side (−Y direction side) of the pallet P.

As shown in FIG. 1, the relay device 16 is movably supported by the rail 36 which is fixed to the hollow column portion 11b (frame 12) and extends in a vertical direction (Z direction), and elevated by being driven by the elevation drive mechanism. The elevation drive mechanism includes, for example, a threaded shaft 38 which is rotatably supported by the hollow column portion 11b and threadably inserted into a nut member (not shown) built into the frame 20, and a motor (not shown) for rotatably driving the threaded shaft 38, and the relay device 16 is elevated by rotatably driving, in forward reverse, the threaded shaft 38 with the motor. The movable range of the elevation drive mechanism is set so as to enable the relay device 16 to move across the entire pallet housing region of the magazine 14. Accordingly, the relay device 16 can insert and remove an arbitrary pallet P housed in the magazine 14.

The parts feeding table 15 receives, from the relay device 16, the pallet P that was pulled out from the magazine 14, and supports the pallet P (tray) to enable the retrieval of the parts by the head unit 5.

As shown in FIG. 5, the parts feeding table 15 includes a rectangular base plate 40 in a planar view, four threaded shafts 42 (corresponds to the support members of the present invention) for supporting the plurality of pallets P in a state of being arranged in a vertical direction in a state where the tray mounted on the topmost pallet P is positioned within the movable range of the head 5a of the parts mounting device 1 and in a state where the upside of the tray is opened, a pallet elevating mechanism (corresponds to the elevating mechanism of the present invention) for synchronously moving, in a vertical direction, the pallets P supported by the threaded shafts 42 in a state where the positional relation thereof is maintained, a width direction positioning mechanism 44 for positioning the pallets P in a width direction (X direction), and a front-back direction positioning mechanism 46 for positioning the pallets P in a front-back direction.

With respect to the parts feeding table 15, in a state where there are no pallets P, the space (referred to as the stock portion Sp) on the inner side of the four threaded shafts 42 is opened upward from the base plate 40.

Figure 7:
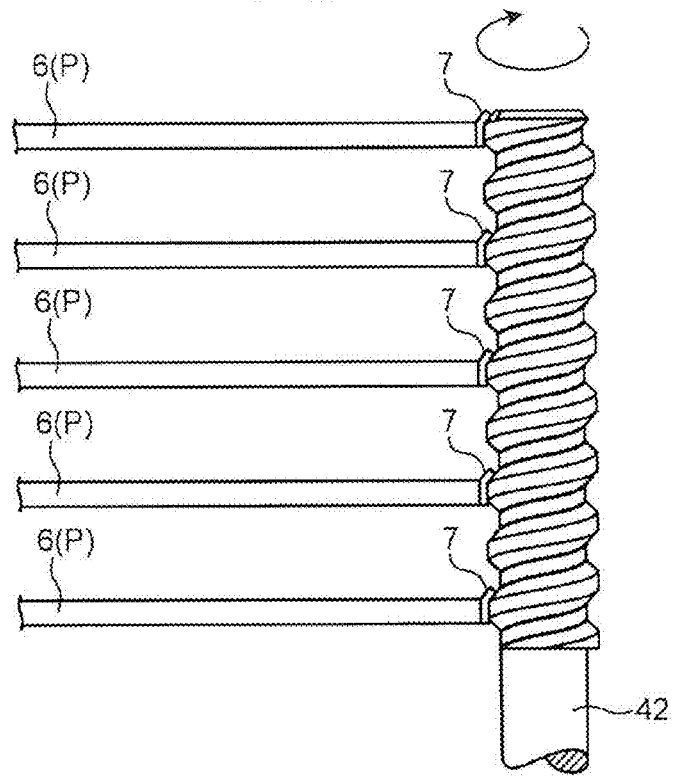
FIG. 7 is a side view showing the threaded shaft and the pallet supported by the threaded shaft.

The four threaded shafts 42 are same threaded shafts in which screw threads of the same shape are continuously formed in a spiral across the tip portion from the position near the base end portion thereof. The respective threaded shafts 42 are erected at the four corners of the base plate 40. Meanwhile, the flange portions 7 of the pallets P are formed so that they can be inserted into the thread grooves of the threaded shaft 42 along the Y direction. In other words, the thread grooves of the threaded shafts are used as the supporting portions of the pallets (hereinafter referred to as the pallet supporting portions as appropriate), and, as shown in FIG. 1 and FIG. 7, the four threaded shafts 42 support the pallets P as a result of the pallets P being inserted between the threaded shafts 42 respectively positioned at either end of the base plate 40 in the width direction (X direction), and the flange portions 7 thereof being inserted into the thread grooves (valleys) of the respective threaded shafts 42. In this example, as shown in FIG. 7, the threaded shafts 42 support the pallets P for every other thread groove in a lateral view, and the pitch of the axial length and screw pitch thereof is set so that up to five pallets P can be supported in parallel in the vertical direction. In addition, the height position of the parts feeding table 15 is set so that the height position of the topmost pallet P when five pallets P are supported as described above; specifically, the height position of the parts in the tray supported by that pallet P becomes the retrieval height position of parts by the head 5a of the parts mounting device 1. Moreover, the height position of the magazine 14 relative to the parts feeding table 15 is set so that the height position of the topmost pallet P and the height position of the topmost pallet P supported by the magazine 14 become substantially equal. In other words, in this example, as described above, the thread grooves (valleys) of the respective threaded shafts 42 become the pallet supporting portions. Specifically, as a result of thread grooves for every two pitches being used as the pallet supporting portions, four threaded shafts 42 have pallet supporting portions of a plurality of levels (five levels). In addition, among the thread grooves of the respective threaded shafts 42, the topmost thread groove to become the retrieval height position of parts by the head unit 5 (head 5a) is the topmost pallet supporting portion.

Note that, when a plurality of pallets P are supported by the threaded shafts 42, the tray (topmost tray) that is supported by the topmost pallet P is opened upward. In a state where the parts feeding device 10 is coupled to the rear side (−Y direction side) of the parts mounting device 1 as described above, the parts feeding table 15 is positioned within the movable range MA (refer to FIG. 1) of the head unit (head 5a) in the XY direction, and the head 5a can adsorb the parts from the tray that is supported by the topmost pallet P of which upside is opened, as a result of being supported at the topmost level.

Figure 6:
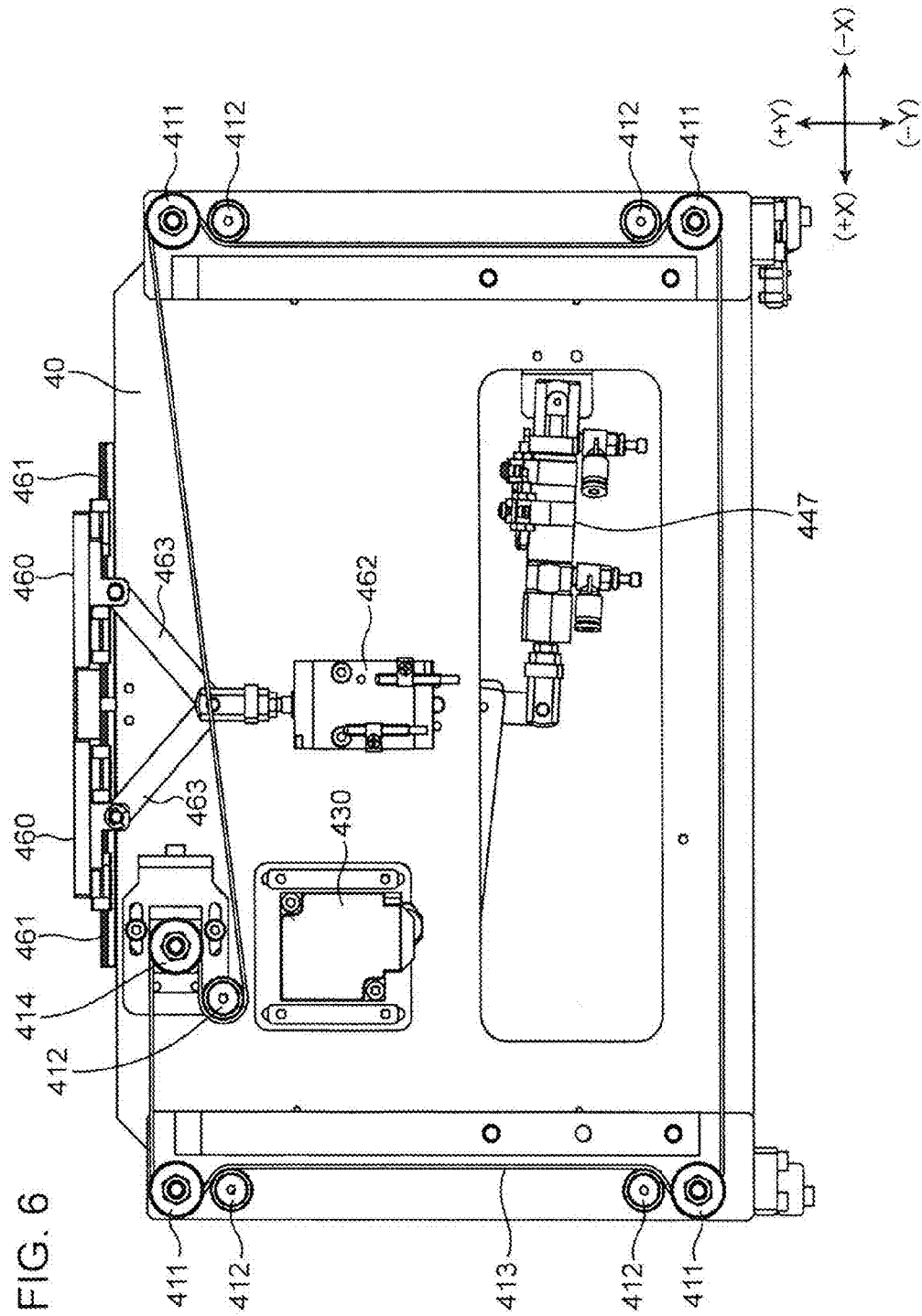
FIG. 6 is a bottom view showing the parts feeding table.

The pallet elevating mechanism is configured to integrally elevate the respective pallets P, which are supported by the threaded shafts 42, while maintaining the positional relation thereof by synchronously rotating the respective threaded shafts 42 in the same direction. Specifically, the pallet elevating mechanism is provided to the base plate 40 as shown in FIG. 5 and FIG. 6, and includes a threaded shaft supporting portion 410 (corresponds to the first supporting portion of the present invention) such as a bearing for rotatably supporting the respective threaded shafts 42 around its axis, and a rotational drive mechanism for synchronously rotating the respective threaded shafts 42 in the same direction. This rotational drive mechanism includes a pulley 411 to be mounted on the respective threaded shafts 42 below the base plate 40, an endless transmission belt 413 that is placed across the pulleys 411, tension pulleys 412, 414 for stretching the transmission belt 413 tightly, a drive pulley 415 that is provided coaxially with the tension pulley 414, a motor 430, a pulley 431 to be mounted on the output shaft of the motor 430, and a drive belt 432 that is placed across the pulley 431 and the drive pulley 415. In other words, the pallet elevating mechanism transmits the rotational drive force of the motor 430 to the respective threaded shafts 42 via each of the pulleys and belts, and switches the rotating direction of the threaded shafts 42 by switching the drive direction of the motor 430. Consequently, the pallet elevating mechanism moves the pallets P in the vertical direction along the thread grooves pursuant to the rotation of the respective threaded shafts 42.

The width direction positioning mechanism 44 positions the respective pallets P based on the center of the base plate 40 in the width direction by sandwiching the pallets P supported by the respective threaded shafts 42 from either end in the width direction thereof. Specifically, the width direction positioning mechanism 44 includes, as shown in FIG. 5, a pair of positioning plates 440 provided to either end of the base plate 40 in the width direction (X direction), and a plate drive mechanism for moving the positioning plates 440 in the X direction.

The respective positioning plates 440 are arranged parallel to each other and facing each other in the X direction, and a plurality of guide grooves 441 are formed on the opposing faces thereof for interposing the flange portions 7 of the pallets P supported by the threaded shafts 42. The respective positioning plates 440 are positioned between the threaded shafts 42 arranged in front and back, and movably supported by the rails 442 which are fixed to the base plate 40 and extend in the X direction. Specifically, the respective positioning plates 440 are supported by the rails 442 so that the ends of the pallets P (flange portions 7) supported by the threaded shafts 42 can move across the actuated position of approaching each other so as to come into contact with the inner bottom portion of the guide grooves 441, and the retracted position which is a position of moving outside from the actuated position and permits the respective pallets P to move in the vertical direction between the respective positioning plates 440.

The plate drive mechanism comprises a first link member 445 extending in the front-back direction and rotatably supported by the base plate 40 via the support shaft 448 at substantially the middle of the longitudinal direction thereof, a pair of second link members 446 which connects either end of the first link member 445 in the longitudinal direction and the respective positioning plates 440 via a hinge structure, and an air cylinder 447 which is coupled to the first link member 445 and drives the first link member 445 around the support shaft 448 according to the switching of feeding and discharging of the air pressure. In other words, the plate drive mechanism oscillates the first link member 445 around the support shaft 448 using the air cylinder 447, and moves the respective positioning plates 440 in the width direction (X direction) across the actuated position and the retracted position via the respective second link members 446 pursuant to the oscillation of the first link member 445.

The front-back direction positioning mechanism 46 positions the pallets P supported by the threaded shafts 42 in the front-back direction based on the front end portion of the base plate 40, and guides the respective pallets P in the vertical direction in the positioned state during the elevation of the pallets P.

The front-back direction positioning mechanism 46 includes a pair of positioning plates 460 having thickness in the front-back direction (Y direction) and arranged in the width direction (X direction) along the front end face of the base plate 40, and a plate drive mechanism for moving the positioning plates 460 in the X direction.

Figure 8:
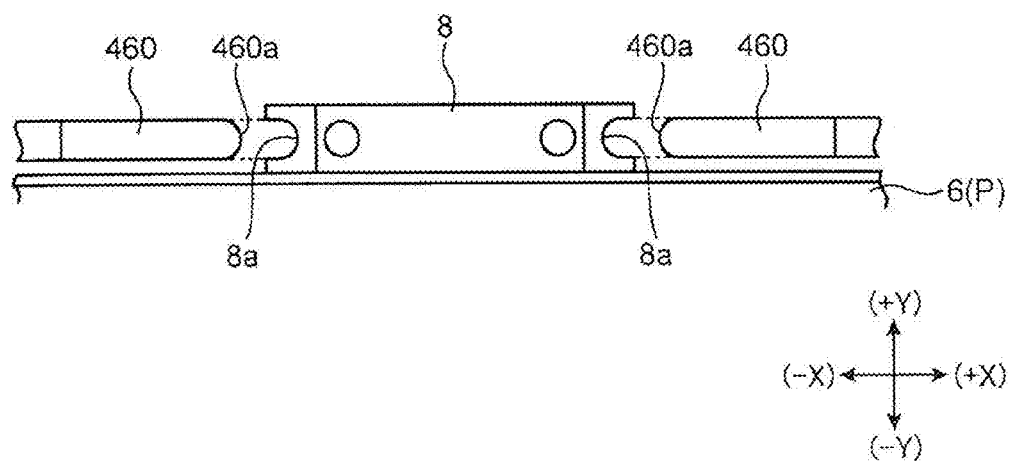
FIG. 8 is a plan view showing the positioning plate of the front-back direction positioning mechanism and the engaged portion of the pallet.

As shown in FIG. 1 and FIG. 5, the respective positioning plates 460 form a substantial right triangle shape in a front view, and comprise guide portions 460a extending in a vertical direction by mutually opposing the X direction. The guide portion 460a of the respective positioning plate 460 is formed in a semicircular shape corresponding to the notch portion 8 of the engaged portion 8, as shown in FIG. 8, so as to enable engagement with the engaged portion 8 on the front side of the pallet P from the outer side (outer side in the X direction), and permit the pallet P to be displaced in a vertical direction while maintaining the foregoing engaged state. Note that the respective guide portions 460a of the positioning plate 460 are subject, for example, to surface treatment such as hard alumite treatment for reducing the coefficient of friction with the pallet P (engaged portion 8).

The respective positioning plates 460 are movably supported by a rail 461 which is fixed to the front end face of the base plate 40 and extends in the X direction. Specifically, the positioning plates 460 are supported displaceably between an actuated position (position shown with a dashed-two dotted line in FIG. 8) where the guide portion 460a engaged with the engaged portions 8 (respective notch portions 8a) of the pallet P supported by the threaded shafts 42, and a retracted position (position shown with a solid line in FIG. 8) of retracting to the outside from the actuated position. In addition, in a state where the respective positioning plates 460 are set at the actuated position, the respective guide portions 460a engage with the engaged portions 8 on the front side of the pallet P, and the pallet P is positioned in the front-back direction based on this engagement. Meanwhile, in a state where the respective positioning plates 460 are set at the retracted position, the movement of the pallet P in the front-back direction is permitted.

The plate drive mechanism includes, as shown in FIG. 6, an air cylinder 462 fixed to a bottom face of the base plate 40 so that the output shaft will move forward and backward along the center line of both base plate 40 (line which passes through the center of the width direction and is parallel to the Y direction), and a pair of links 463 which are respectively coupled, via a hinge structure, to the operating shaft of the air cylinder 462 and the respective base plate 40. According to the foregoing configuration, the plate drive mechanism is configured to evenly move the respective base plate 40 in the width direction via the links 463 based on the operation of the air cylinder 462.

Note that, in FIG. 5, reference numeral 48 shows the pallet guide members that are erected at the rear end of the base plate 40 and at either end in the width direction thereof. The pallet guide members 48 guide the flange portion 7 of the respective pallets P upon the insertion and removal of the pallet P into and from the parts feeding table 15 by the relay device 16. The respective pallet guide members 48 are provided with a guide groove 481 that is equivalent to the guide groove 441 of the positioning plate 440.

As shown in FIG. 1, the tape feeding retaining portion 18 is fixed to the side of the hollow column portion 11b of the frame 20. The tape feeding retaining portion 18 supports a plurality of tape feeders (not shown) in a state of being arranged in the width direction. Note that the tape feeders comprise a reel which is wound with a tape that houses and retains small chip parts such as an IC, transistor, and capacitor, and supply parts to the head unit 5 of the parts mounting device 1 while intermittently reeling out the tape from the reel.

The operation of feeding parts with the foregoing parts feeding device 10 is now explained. Note that, while not shown, the parts feeding device 10 comprises a control device for controlling the parts feeding table 15 and the relay device 16, and the following operation is performed by the control device controlling the parts feeding table 15 and the relay device 16.

<Retrieval of Pallet P from Magazine 14>

The relay device 16 moves in a vertical direction, and stops at the height position corresponding to the pallet P supporting the intended tray; that is, the height position that enables the pallet P to be retrieved onto the guide portion 24. Here, the respective insertion/removal heads 25A, 25B are disposed at a predetermined standby position within the movable range, and the respective engaging portions 253 are set at the retracted position.

Figure 9A:
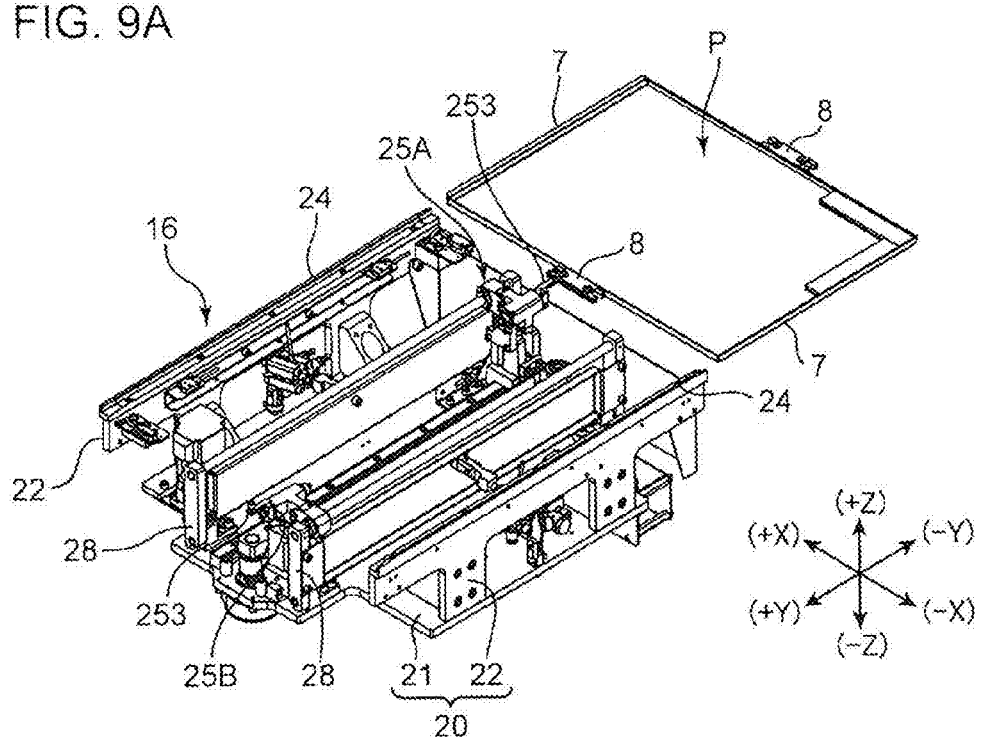
FIG. 9A shows the state immediately before the pallet is pulled out from the magazine.

When the relay device 16 reaches the height position corresponding to the intended pallet P, as shown in FIG. 9A, the first insertion/removal head 25A moves to the rear end within its movable range, and the engaging portion 253 of the first insertion/removal head 25A is thereafter switched from the retracted position to the actuated position. Based on this switch, the engagement claws 253a engage with the engaged portions 8 (notch portions 8a) on the front side of the pallet P, and the pallet P and the first insertion/removal head 25A are thereby coupled. Subsequently, in this state, by the first insertion/removal head 25A moving forward (+Y direction), the pallet P is pulled into the relay device 16 while being supported by the guide portions 24. Moreover, in conjunction with the movement of this first insertion/removal head 25A, the second insertion/removal head 25B moves rearward (-Y direction). Here, the engaging portions 253 of the second insertion/removal head 25B are set at the retracted position and, therefore, the engaging portions 253 (engagement claws 253a) will not interfere with the pallet P.

When the positions of the insertion/removal heads 25A, 25B are switched front and back, and both insertion/removal heads 25A, 25B are moved to a position which enables the engaging portions 253 of the second insertion/removal head 25B to become engaged with the engaged portions 8 on the rear side of the pallet P, the engaging portions 253 of the second insertion/removal head 25B are switched from the retracted position to the actuated position, and thereafter the engaging portions 253 of the first insertion/removal head 25A are switched from the actuated position to the retracted position. In other words, the coupling of the pallet P and the first insertion/removal head 25A is released, and the pallet P becomes coupled with the second insertion/removal head 25B.

<Transfer of Pallet P to Parts Feeding Table 15>

When the pallet P is pulled into the relay device 16 from the magazine 14, or when the pallet P is pulled into the relay device 16 and the switching of coupling of the insertion/removal heads 25A, 25B and the pallet P is completed, the relay device 16 moves in a vertical direction, and stops at a height position which enables the pallet P to be fed from the guide portions 24 to the parts feeding table 15 (threaded shafts 42). Here, as described above, the threaded shaft 42 can support the pallets P vertically at five levels, and the relay device 16 stops at a height position corresponding to the intended level among the five levels.

Figure 9B:
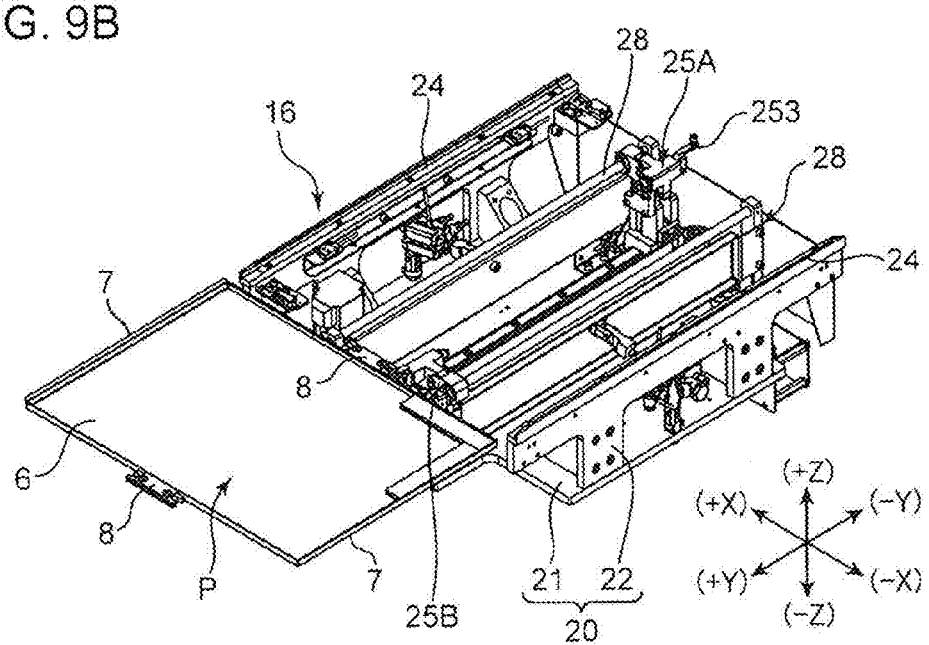
FIG. 9B shows the state immediately after the pallet is transferred to the parts feeding table (threaded shaft)
Figure 10A:
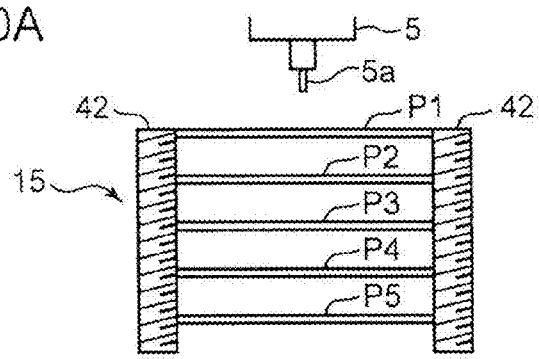
FIG. 10A to FIG. 10D are schematic diagrams of the parts feeding table showing an example of the parts feeding operation performed by the parts feeding device.
Figure 10B:
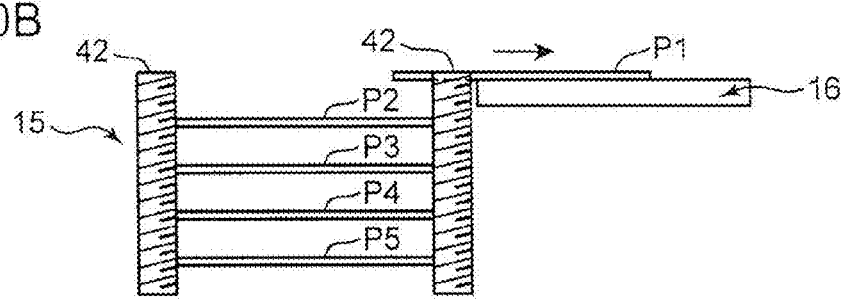
Figure 10C:
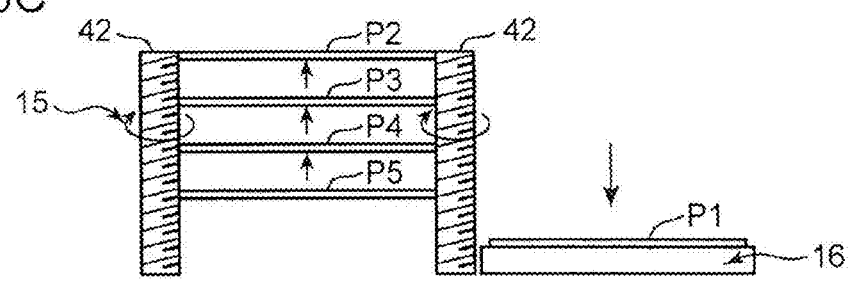
Figure 10D:
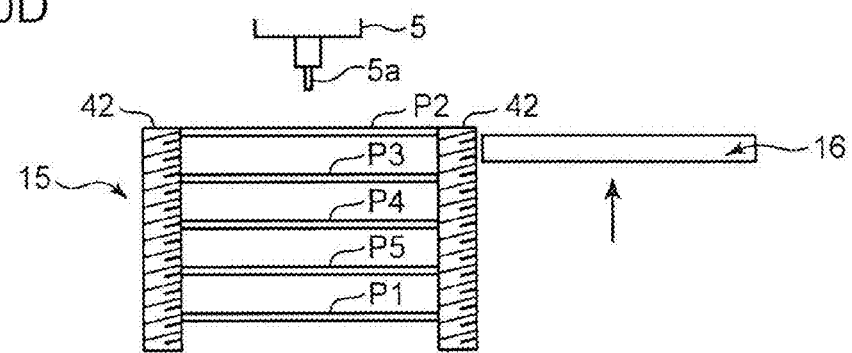

When the relay device 16 reaches the height position corresponding to the intended level, the second insertion/removal head 25B moves forward and, as shown in FIG. 9B, the pallet P is pushed out from the relay device 16 toward the parts feeding table 15 along the guide portions 24. Here, the pallet P is foremost guided into the thread grooves of the respective threaded shafts 42 on the rear side while the flange portions 7 thereof are guided along the guide grooves 481 of the pallet guide members 48, and additionally guided into the thread grooves of the respective threaded shafts 42 on the front side while being guided along the guide grooves 441 of the positioning plates 440. The pallet P is thereby supported by the four threaded shafts 42. Here, the respective positioning plates 440 of the width direction positioning mechanism 44 and the respective positioning plates 460 of the front-back direction positioning mechanism 46 are all set at the retracted position.

When the second insertion/removal head 25B moves to the front end of its movable range (or predetermined front position), and the pallet P is pushed out from the relay device 16 completely and the pallet P is completely supported by the threaded shafts 42, the positioning plates 460 of the front-back direction positioning mechanism 46 are switched from the retracted position to the actuated position. The guide portions 460a of the respective positioning plates 460 thereby become engaged with the engaged portions 8 (notch portions 8a) on the front side of the pallet P, and the pallet P is positioned in the parts feeding table 15 in the front-back direction. Moreover, concurrently with the above, both positioning plates 440 of the width direction positioning mechanism 44 are switched to the actuated position, and the pallet P is thereby positioned in the parts feeding table 15 in the width direction. Subsequently, by the engaging portions 253 of the second insertion/removal head 25B being switched from the actuated position to the retracted position, the coupling of the pallet P and the second insertion/removal head 25B is released.

<Feeding of Parts to Parts Mounting Device 1>

Here, for example, when the pallet P mounting the tray housing the parts to be retrieved is supported at the topmost level of the stock portion Sp, the head unit 5 of the parts mounting device 1 retrieves the parts from the tray mounted on that pallet P.

Meanwhile, when the pallet P is supported, for example, by the second level (second level from the top) of the stock portion Sp and another pallet P is being supported by the topmost level, the topmost pallet P is retrieved from the parts feeding table 15 to the relay device 16, the pallet P of the second level is moved up to the topmost level, and then the retrieval of parts from that pallet P is performed.

The moved up of the pallet P is performed by the four threaded shafts 42 being rotationally driven synchronously in the same direction based on the operation of the motor 430. In other words, as a result of the respective threaded shafts 42 rotating in synch, the pallet P is elevated from the second level to the topmost level along the thread grooves. Note that, when the threaded shafts 42 are rotationally driven as described above, while a state where the positioning plates 460 of the front-back direction positioning mechanism 46 are set at the actuated position is maintained, the respective positioning plates 440 of the width direction positioning mechanism 44 are set at the retracted position. Consequently, the pallet P can be stably elevated while the engaged portions 8 thereof are guided along the positioning plates 460 (guide portions 460a). Moreover, when the pallet P reaches the topmost level, the respective positioning plates 440 are driven forward and backward one or more times between the retracted position and the actuated position based on the operation of the width direction positioning mechanism 44, and the positioning of the pallet P in the width direction is thereby performed. In addition, after the positioning of the pallet P, in a state where the respective positioning plates 460 of the front-back direction positioning mechanism 46 and the respective positioning plates 440 of the width direction positioning mechanism 44 are still respectively set at the actuated position, the head unit 5 retrieves parts from the tray mounted on that pallet P.

<Housing of Pallet P>

The pallet P that completed the feeding of parts is retrieved from the parts feeding table 15 onto the relay device 16, and returned to the magazine 14 according to an operation that is the opposite to the foregoing operation. In other words, after the relay device 16 moves the height position corresponding to the topmost pallet P, the pallet P supported by the threaded shafts 42 is pulled from the parts feeding table 15 onto the relay device 16 using the second insertion/removal head 25B. Subsequently, the relay device 16 moves in the vertical direction, and, during this movement, the coupling of the pallet P and the second insertion/removal head 25B is released and the pallet P is coupled with the first insertion/removal head 25A. Subsequently, when the relay device 16 reaches the housing height position of the intended empty pallet of the magazine 14, the first insertion/removal head 25A moves to the rear side and the pushes the pallet P from the relay device 16 into the magazine 14, and, after the foregoing pushing, the coupling of the first insertion/removal head 25A and the pallet P is released. The housing of the pallet P into the magazine 14 is thereby completed. Note that, as described above, the respective positioning plates 440 of the width direction positioning mechanism 44 are retained at the retracted position during the elevation of the pallet P and during the delivery of the pallet P to the relay device 16, and are otherwise retained at the actuated position. Meanwhile, the respective positioning plates 460 of the front-back direction positioning mechanism 46 are retained at the retracted position during the delivery of the pallet P to the relay device 16, and are otherwise retained at the actuated position.

The series of basic operations for supplying parts to the parts mounting device 1 (head unit 5) from the parts feeding device 10 were explained above, and now an example of a specific operation is now explained with reference to FIG. 10. The example shown in FIG. 10 is a example of the operation that is useful upon feeding, to the parts mounting device 1, five types of specific parts as one set among the parts housed in the magazine 14; for instance, upon mounting the five types of parts on a single substrate 3.

In this example, foremost, the pallets P1 to P5 respectively supporting the five types of parts (trays) are pulled out from the magazine 14 according to the foregoing operation and transferred to the parts feeding table 15. In the foregoing case, the respective pallets P1 to P5 are caused to be supported by the threaded shafts 42 such that the parts that were retrieved by the head unit 5 early (parts in which the mounting order in the parts mounting device 1 is early) are positioned at a higher level (FIG. 10A; corresponds to the pallet retrieval step of the present invention).

Subsequently, when the first part supported by the pallet P1 positioned at the topmost level (topmost position) is retrieved by the head unit 5, the pallet P1 is retrieved from the parts feeding table 15 to the relay device 16, and, after the foregoing retrieval, the threaded shafts 42 are immediately rotationally driven, and the respective pallets P2 to P5 supported by the second level to the fifth level are synchronously moved up one level each. Consequently, the pallet P2 supporting the subsequent part is disposed at the topmost level from which that part can be retrieved by the head unit 5. Moreover, the relay device 16 is lowered and the original topmost pallet P1 is moved to the bottommost level (bottommost position; fifth level) (FIG. 10B to FIG. 10D; corresponds to the first pallet moving step of the present invention).

Subsequently, in a similar manner, the topmost pallet P is retrieved onto the relay device 16 pursuant to the retrieval of parts from the pallet P position at such topmost level, the other pallets P are synchronously moved up one level each, and then the original topmost pallet P is moved to the bottommost level. Consequently, the five types of parts are repeatedly fed to the parts mounting device 1.

As described above, the parts feeding device 10 comprises, separate from the relay device 16 which inserts and removes the pallets P into and from the magazine 14, a parts feeding table 15 having the functions of being able to stock the retrieved pallets P in a plurality of vertical levels (at least two levels) and, in a state with no pallets P, opening the stock portion Sp of the plurality of vertical levels upward, and moving the stocked pallets P in the vertical direction. Thus, the relay device 16 can proceed to the retrieval operation (retrieval operation from the magazine 14) of the subsequent pallet P (subsequent parts) while feeding the preceding pallet P (preceding parts) to the parts feeding table 15 and leaving it at the topmost level of the stock portion Sp. Thus, according to this parts feeding device 10, parts can be fed efficiently in comparison to a conventional parts feeding device. In other words, with a conventional feeding device (Patent Document 1 explained in the Background Art) which has only a magazine and a retrieval portion for inserting and removing the pallets into and from the magazine, and which directly retrieves parts from the pallet that was retrieved to the retrieval portion, preparation for the subsequent pallet (parts) cannot be carried out until the retrieval of parts of the preceding pallet is completed, and that pallet is additionally returned to the magazine. Thus, the head on the parts mounting device side will be subject to a standby time. Meanwhile, according to the parts feeding device 10, by transferring the preceding pallet P to the parts feeding table 15 and thereafter immediately proceeding to the retrieval operation of the subsequently pallet P, the subsequent pallet P (parts) can be prepared at the lower level of the stock portion Sp of the parts feeding table 15 in advance by leveraging the retrieval period of parts in the preceding pallet P by the head unit 5, and the relay device 16 can also be moved to and caused to stand by at the height position that is the same as the topmost level. In addition, after the retrieval of parts from the preceding pallet P is completed, by retrieving the preceding pallet P from the parts feeding table 15 to the relay device 16, and elevating the subsequent pallet P (parts) to the topmost level, the parts of the subsequent pallet P can be promptly fed. Thus, according to this parts feeding device 10, it is possible to shorten the conventional standby time, and parts can be efficiently fed in comparison to a conventional parts mounting device by that much.

Moreover, if a plurality of pallets P are prepared on the parts feeding table 15 in advance by using the relay device 16 so that the parts (trays) are disposed according to the feeding order in order from the higher position, after the retrieval of parts by the head unit 5, the pallets P on the parts feeding table 15 can be automatically moved up and retrieval of the subsequent parts can be performed from the topmost pallet P merely by causing the relay device 16 to retrieve the topmost pallet P from the parts feeding table 15. Note that the preceding pallet P that was retrieved by the relay device 16 is either returned to the magazine 14, or housed in a lower level of the stock portion Sp of the parts feeding table 15 (pallet supporting portion that is not retaining a pallet P). In the foregoing case, parts can be fed continuously from different pallets P to the parts mounting device 1 in a predetermined order in an extremely short time pitch. Thus, according to this parts feeding device 10, parts can be fed efficiently with respect to this point also. In particular, when there are demands for continuously and repeatedly feeding, in a predetermined order, a plurality of types of specific parts as one set, as with the example of FIG. 10, a plurality of pallets P1 to P5 are caused to be supported by the threaded shafts 42 in advance so that the parts (trays) are disposed in order from the higher position according to the feeding order, and the pallets P1 to P5 are thereafter caused to circulate on the parts feeding table 15. In other words, as described above, by retrieving the topmost pallet P using the relay device 16 and synchronously moving up the other pallets P one level each and thereafter moving the original topmost pallet P to the bottommost position, the parts of the foregoing set can be repeatedly fed to the parts mounting device 1 in an efficient manner. According to this kind of method, there is no need to insert and remove the pallets into and from the magazine each time for each of the parts as with a conventional parts feeding device, and the parts of the foregoing set can be repeatedly fed to the parts mounting device 1 in an extremely short time pitch. Thus, according to this parts feeding device 10, parts can be fed efficiently with respect to this point also.

Moreover, the parts feeding table 15 comprises a plurality of threaded shafts 42 as the support members of the pallet P, and is configured to support the pallet P by interposing the flange portions 7 of that pallet P into the thread grooves of the threaded shafts 42, and synchronizing the pallet P and moving the pallet P in the vertical direction pursuant to the rotation of the threaded shafts 42 by the respective threaded shafts 42 by rotationally driven in synch. According to this kind of configuration of the parts feeding table 15, the respective pallets P can by synchronously moved smoothly in the vertical direction only with the operation (rotation) of the support members (threaded shafts 42) without requiring the movement of the support members (threaded shafts 42) supporting the pallet P in the vertical direction. Accordingly, there is also an advantage in that the foregoing vertical movement of the pallet P can be achieved with an extremely simple configuration and with a relative small drive force while suppressing the space occupied by the pallet elevating mechanism.

Moreover, the parts feeding table 15 comprises a width direction positioning mechanism 44 and a front-back direction positioning mechanism 46, and, since the pallet supported by the threaded shafts 42 can be positioned in the front-back direction (Y direction) and the width direction (X direction), there is an advantage in that the retrieval of parts by the head unit 5 can be performed accurately while moving the pallet P in the vertical direction based on the drive of the threaded shafts 42 as described above. In other words, with the foregoing configuration, as a result of the rotating force of the threaded shafts 42 working on the pallet P, the respective pallets P may become displaced in the front-back direction and the width direction relative to the threaded shafts 42. Nevertheless, according to the parts feeding table 15 comprising the width direction positioning mechanism 44 and the front-back direction positioning mechanism 46, since the positioning plates 440 of the width direction positioning mechanism 44 are set at the actuated position after the pallet P is moved in the vertical direction, and the positioning plates 460 of the front-back direction positioning mechanism 46 are set to the actuated position during and after the movement of the pallet P in the vertical direction, it is possible to inhibit or prevent the displacement of the pallet P described above. Thus, according to this parts feeding device 10, while adopting a configuration of using the threaded shafts 42 as the support members of the pallet P and moving the pallet P in the vertical direction pursuant to the rotation of the threaded shafts 42, it is possible to accurately perform the retrieval of parts using the head unit 5.

Note that, with the parts feeding table 15, the width direction positioning mechanism 44 can be omitted. In the foregoing case, a plurality of reference marks are provided to the pallet P in advance (for example, two reference marks are provided to the outer peripheral of the pallet P), and, in a state where the pallet P is disposed at the topmost level of the parts feeding table 15, the respective reference marks of the pallet P are imaged and recognized using a substrate camera (not shown) mounted on the head unit 5. In addition, by performing positional correction of the head unit 5 in the XY direction based on the recognition results, and causing the head unit 5 to retrieve parts from the tray on that pallet P, it is possible to reliably and accurately perform the retrieval of parts.

Note that, in the foregoing examples of FIG. 10A to FIG. 10D, when the retrieval of parts from the pallet P positioned at the topmost level is completed, the topmost pallet P is retrieved onto the relay device 16, the other pallets P of the stock portion Sp are synchronously moved up one level each, and the original topmost pallet P on the relay device 16 is moved to the bottommost level of the parts feeding table 15 so as to repeatedly feed the five types of parts to the parts mounting device 1. Nevertheless, the five types of parts may also be repeatedly fed to the parts mounting device 1 with an opposite method (in other words, corresponds to the "second pallet moving step" of the present invention). In other words, in a state where the pallets P of five vertical levels are supported by the parts feeding table 15 (state shown in FIG. 10A), the pallet P of the bottommost level (bottommost position) is retrieved from the parts feeding table 15 to the relay device 16 while the first part supported by the pallet P positioned at the topmost level (topmost position) is being retrieved by the head unit 5, the relay device 16 is moved upward, and the pallet P is caused to stand by at the height position corresponding to the topmost level of the stock portion Sp. Subsequently, at the point in time that the retrieval of parts, by the head unit 5, supported by the pallet P positioned at the topmost level is completed, the threaded shaft 42 is rotationally driven to synchronously move down, one level each, the respective pallets P that are being supported by the topmost level (first level) to the fourth level. Thereafter, the original bottommost pallet P is transferred from the relay device 16 to the topmost level of the parts feeding table 15. With this kind of method also, similar to the case of the example shown in FIG. 10A to FIG. 10D, the five types of parts can be repeatedly fed to the parts mounting device 1 in an efficient manner. Note that, in the foregoing case, the pallets P1 to P5 are set on the parts feeding table 15 in an arrangement that is vertically opposite to the example of FIG. 10A to FIG. 10D.

Moreover, with the parts feeding device 10, parts can also be efficiently fed to the parts mounting device 1 based on the following method. In other words, the relay device 16 is caused to retrieve the intended pallet P (parts) from the magazine 14 and transfer it to the topmost level of the parts feeding table 15, the relay device 16 retrieves the subsequent pallet P from the magazine 14 while the head unit 5 is retrieving the parts (preceding parts) from the preceding pallet P, and the pallet P is caused to stand by at the same height position as the topmost level of the parts feeding table 15. In addition, at the point in time that the retrieval of parts (preceding parts) from the preceding pallet P is completed, the threaded shaft 42 is rotationally driven to move down the topmost preceding pallet P, together with the other pallets P, one level each, and the pallet P standing by on the relay device 16 is transferred to the topmost level of the parts feeding table 15. Thereafter, the relay device 16 is lowered while the head unit 5 is retrieving the parts from the topmost pallet P, the unneeded pallet P (pallet P mounted on a tray from which parts do not need to be fed) disposed at the lower level of the parts feeding table 15 is retrieved, and the pallet P is housed in the magazine 14. Subsequently, the relay device 16 additionally retrieves the next pallet P from the magazine 14, and causes that pallet P to stand by at the same height position as the topmost level of the parts feeding table 15. By subsequently repeating the foregoing operation, parts can be efficiently fed to the parts mounting device 1.

Moreover, in the example of the parts feeding table 15 described above, while the pallet P is supported with four threaded shafts 42, the number of threaded shafts 42 is not limited to four so as long as it is a number that can stably support the pallet P and move the pallet P in the vertical direction.

Another embodiment (parts feeding table 15A) of the parts feeding table in the parts feeding device 10 is now explained with reference to FIG. 11 and FIG. 12. The parts feeding table 15A shown in the diagrams is built into the parts feeding device 10 in substitute for the foregoing parts feeding table 15.

This parts feeding table 15A comprises a substantially rectangular base plate 50 in a planar view, a pair of plate-shaped first pallet support members 52 positioned at either end of the base plate 50 in the width direction (X direction) and facing each other in the width direction, a pair of plate-shaped second pallet support members 54 arranged near and on the inner side of the first pallet support members 52 and facing each other in the width direction, a first support member drive mechanism for moving the first pallet support members 52 in the arranged direction thereof (X direction/corresponds to the second direction of the present invention), and a second support member drive mechanism for moving the second pallet support members 54 in the arranged direction thereof (X direction) and in the vertical direction (Z direction).

Note that, in the parts feeding table 15A, the pair of first pallet support members 52 corresponds to "a pair of support members of the present invention", the rail 58 described later corresponds to the "second supporting portion" of the present invention, the first support member drive mechanism corresponds to the "support member drive mechanism" of the present invention, and the second pallet support member 54 and the second support member drive mechanism and the like correspond to the "transport mechanism" of the present invention. Accordingly, the rail 58, the first support member drive mechanism, the second pallet support member 54 and the second support member drive mechanism and the like correspond to the elevating mechanism of the present invention. This is now explained in detail.

The pair of first pallet support members 52 each comprises a substantially rectangular plate 53a in a lateral view which is elongated in the front-back direction (Y direction), a pair of support blocks 53b which is each fixed to an opposing face of each plate 53a at either end thereof in the front-back direction, and an intermediate block 53c which is fixed to the plate 53a at a position that is the upper end of the opposing face of the plates 53a and between the support blocks 53b.

The support block 53b of the respective first pallet support members 52 comprises a plurality of guide grooves 531, on the opposing face thereof, which are arranged in the vertical direction and extend in the front-back direction, and can support the pallets P as a result of the flange portions 7 of the pallets P being inserted into the guide grooves 531. Note that each support block 53b comprises four guide grooves 531, and the respective first pallet support members 52 support the pallets P with the guide grooves 531, and support the pallets P (flange portions 7) with the upper face of the support block 53b and the intermediate block 53c. In other words, a plurality of levels (5 levels) of pallet supporting portions are configured from the guide grooves 531, and the upper face of the support block 53b and the intermediate block 53c. Accordingly, this parts feeding table 15A can also support up to five pallets P arranged in the vertical direction as with the parts feeding table 15 shown in FIG. 5.

The respective first pallet support members 52 are movably supported, via the base 56, by the rails 58 which are fixed to the base plate 50 and extend in the X direction. Specifically, the respective first pallet support members 52 are supported by the rails 58 to be movable across an approaching position where the pallets P (flange portions 7) can be supported by the support blocks 53b and the intermediate blocks 53c, and a separated position in which the spacing is broader than the approaching position. In addition, the respective first pallet support members 52 are driven by the first support member drive mechanism.

The first support member drive mechanism comprises a first link member 61 extending in the front-back direction and rotatably supported by the base plate 50 via the support shaft 50a at substantially the middle of the longitudinal direction thereof, a pair of second link members 62 which connects either end of the first link member 61 in the longitudinal direction and the base 56 via a hinge structure with the support shaft 50a as the boundary, and an air cylinder 60 which is coupled to the first link member 61 and drives the first link member 61 around the support shaft 50a according to the switching of feeding and discharging of the air pressure. In other words, the first support member drive mechanism oscillates the first link member 61 around the support shaft 50a using the air cylinder 60, and moves the respective first pallet support members 52 between the approaching position and the separated position via the respective second link members 62 pursuant to the oscillation of the first link member 61.

The pair of second pallet support member 54 is a substantially rectangular plate-shaped block member in a lateral view which is elongated in the front-back direction (Y direction). The second pallet support members 54 are disposed so as to be interposed between the respective plates 53a of the pair of first pallet support members 52, and between the front and back support blocks 53b of the respective first pallet support members 52. The second pallet support members 54 comprise four guide grooves 541, on the opposing face thereof, which are arranged in the vertical direction and extend in the front-back direction, and can support the pallets P as a result of the flange portions 7 of the pallets P being inserted into the guide grooves 541.

The respective second pallet support members 54 are affixed to the moving plate 64 which is elevatably supported on the base plate 50 via a guide member not shown. Consequently, the second pallet support members 54 are elevatably supported relative to the base plate 50 via the moving plate 64. Specifically, all (four) guide grooves 541 are movably supported across the moved up position which coincides with the guide grooves 531 of the support blocks 53b, and the lowering position which is displaced downward relative to the first pallet support member 52 in an amount of one pitch worth of the guide grooves 541. FIG. 11 shows a state where the second pallet support members 54 are disposed at the lowering position.

Moreover, the respective second pallet support members 54 are movably supported, via the base 66, by the rails 68 fixed to the moving plate 64 and extending in the X direction. Specifically, the respective second pallet support members 54 are supported by the rails 68 to enable movement across an approaching position where the pallets P (flange portions 7) can be supported, and a separated position in which the spacing is broader than the approaching position.

The second support member drive mechanism comprises an air cylinder 65 which is fixed to the bottom face of the base plate 50 and moves the moving plate 64 in a vertical direction relative to the base plate 50 according to the switching of feeding and discharging of the air pressure. Moreover, the second support member drive mechanism comprises a first link member 71 extending in the front-back direction and rotatably supported by the moving plate 64 via the support shaft 64a at substantially the middle of the longitudinal direction thereof, a pair of second link members 72 which connects either end of the first link member 71 in the longitudinal direction and the base 66 via a hinge structure with the support shaft 64a as the boundary, and an air cylinder 70 which is coupled to the first link member 71 and drives the first link member 71 around the support shaft 64a according to the switching of feeding and discharging of the air pressure. In other words, the second support member drive mechanism moves the respective second pallet support members 54 between the moved up position and the lowering position by elevating the moving plate 64 with the air cylinder 65 and oscillates the first link member 71 around the support shaft 64a with the air cylinder 70, and thereby moves the respective second pallet support members 54 between the approaching position and the separated position via the respective second link members 72 pursuant to the oscillation of the first link member 71.

Note that, in a state where both first pallet support members 52 and both second pallet support members 54 are disposed at the approaching position, the position of the guide grooves 531 (inner bottom portions) of the respective support blocks 53b of the respective first pallet support members 52 and the position of the guide grooves 541 (inner bottom portions) of the respective second pallet support members 54 will coincide in the X direction, and consequently both first pallet support members 52 and both second pallet support members 54 can support the pallets P (flange portions 7). Meanwhile, from this state, when only both first pallet support members 52 are disposed at the separated position, the position of the guide grooves 53 of both support blocks 53b of the respective first pallet support members 52 will become displaced outside the X direction relative to the position of the guide grooves 541 of the respective second pallet support members 54. In other words, the position of the guide grooves 53 of both support blocks 53b of the respective first pallet support members 52 will become displaced more on the outer side in the X direction than the position of the flange portions 7 of the pallets P supported by the respective second pallet support members 54 at the ends in the X direction. Consequently, both second pallet support members 54 can move in the vertical direction at a position that is on the inner side of the plates 53a of both first pallet support members 52 while supporting the pallets P.

Moreover, so that each of the second pallet support members 54 can move to the approaching position and the separated position in a state where the respective first pallet support members 52 are disposed at the approaching position, the thickness dimension (thickness dimension in the X direction) of the second pallet support members 54 is formed to be smaller than the thickness dimension of the support blocks 53b of the first pallet support members 52. Consequently, as shown in FIG. 12, the respective second pallet support members 54 can be moved to the separated position while maintaining the state where the pallets P are being supported by the respective first pallet support members 52 (support blocks 53b). In other words, the position of the opposing faces of the second pallet support members 54 can be disposed more on the outside in the X direction than the position of the guide grooves 531 (inner bottom portions) of the support blocks 53b of the first pallet support members 52. In this state also, a gap is maintained between the respective second pallet support members 54 and the plates 53a of the first pallet support members 52, and the respective second pallet support members 54 can move in the vertical direction at the separated position.

With this parts feeding table 15A, the pallets P can be supported in a state where the respective first pallet support members 52 are set to the approaching position and the respective second pallet support members 54 are set to the approaching position and the moved up position. In addition, in the foregoing state, similar to the type shown in FIG. 5, the pallets P are delivered to and from the relay device 16. In other words, in this state, the four guide grooves 531 of the first pallet support members 52 and the four guide grooves 541 of the second pallet support members 54 mutually coincide in the vertical direction and form four groove portions capable of supporting the pallets P which are arranged in the vertical direction, and the upper face of the support blocks 53b of the first pallet support members 52 and the upper face of the second pallet support members 54 form one supporting portion capable of supporting the pallets P. It is thereby possible to support up to five pallets P.

Note that the elevation (moved up and lowering) of the pallets P supported by the parts feeding table 15A is performed as follows. The elevation operation of the pallets P in the parts feeding table 15A is now explained with reference to FIG. 13A to FIG. 13D, FIG. 14A to FIG. 14D taking a case of performing the same operation as the example illustrated in FIG. 10A to FIG. 10D. Note that these diagrams conceptually show the operation of the respective pallet support members 52, 54. Structurally, while the second pallet support members 54 will never actually move outside the first pallet support members 52, in certain diagrams (for example, FIG. 13C and so on), for the sake of convenience for explanation, the second pallet support members 54 are depicted as moving outside the first pallet support members 52.

Figure 13A:
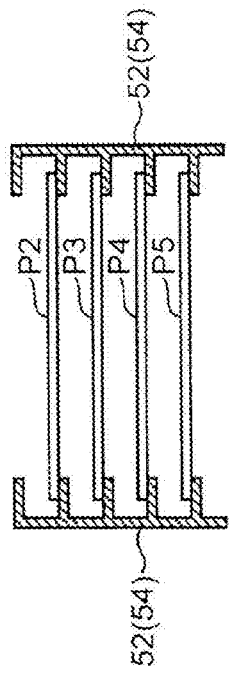
FIG. 13A to FIG. 13D are schematic diagrams explaining the move-up operation of the pallet on the parts feeding table.

Foremost, as shown in FIG. 13A, let it be assumed that the pallets P1 to P5 supporting the parts (tray) are pulled out from the magazine 14 and transferred to the parts feeding table 15A, and the respective pallets P1 to P5 are being supported by the pallet support members 52, 54 such that the parts that were retrieved by the head unit 5 early (parts in which the mounting order in the parts mounting device 1 is early) are positioned at a higher level. Here, as described above, the respective first pallet support members 52 are set to the approaching position, and the respective second pallet support members 54 are set to the approaching position and the moved up position.

Figure 13B:
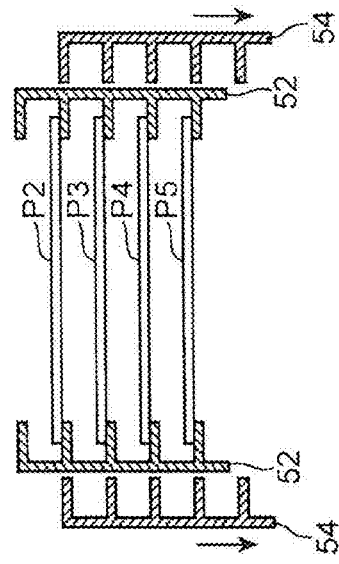
Figure 13C:
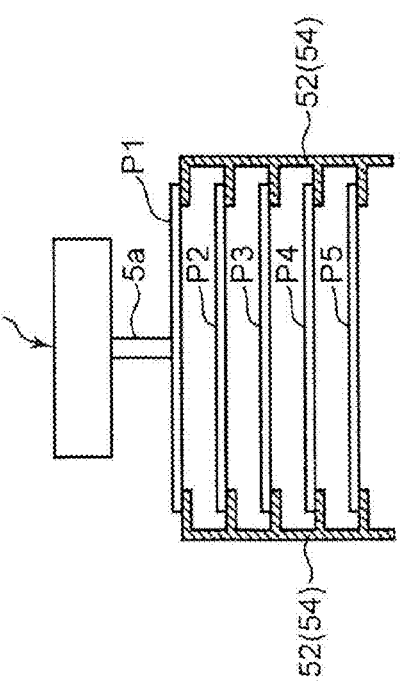
Figure 13D:
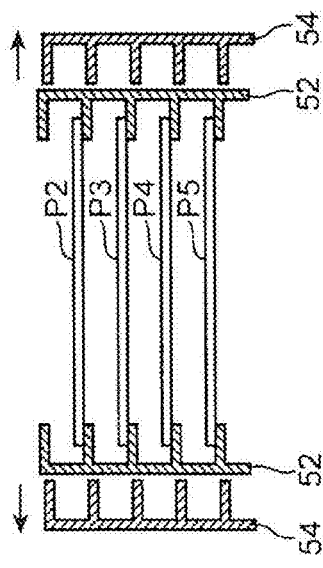
Figure 14A:
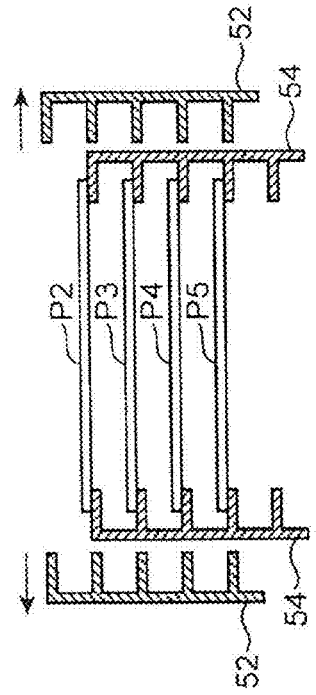
FIG. 14A to FIG. 14D are schematic diagrams explaining the move-up operation of the pallet on the parts feeding table.

When the parts supported by the pallet P1 positioned at the topmost level (topmost position) are retrieved by the head unit 5, the pallet P1 is retrieved from the parts feeding table 15A onto the relay device 16 (FIG. 13B). When the topmost pallet P1 is retrieved, the respective second pallet support members 54 move to the separated position, and additionally move from the moved up position to the lowering position, and thereafter move from the separated position to the approaching position (FIG. 13C, FIG. 13D, FIG. 14A). The second pallet support members 54 is thereby offset downward relative to the first pallet support members 52, and the position of the guide grooves 541 of the second pallet support members 54 supporting the pallets P2 to P5 is displaced upward by one level.

Figure 14C:
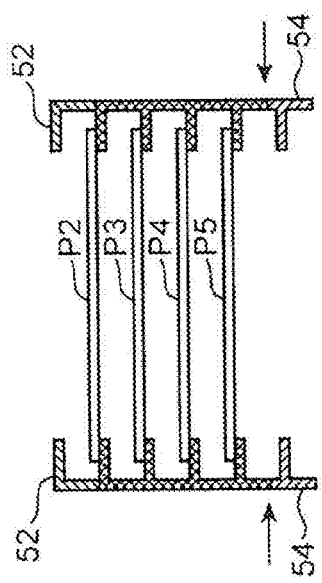
Figure 14B:
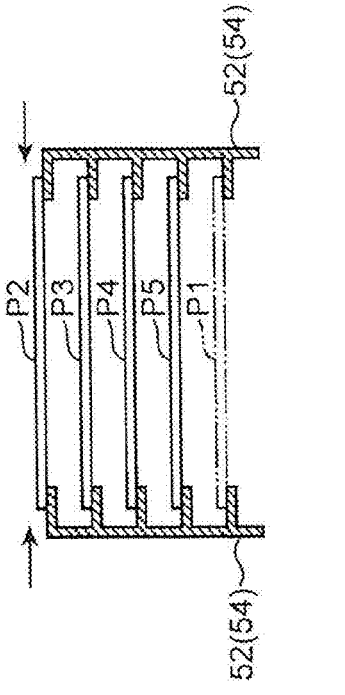
Figure 14D:
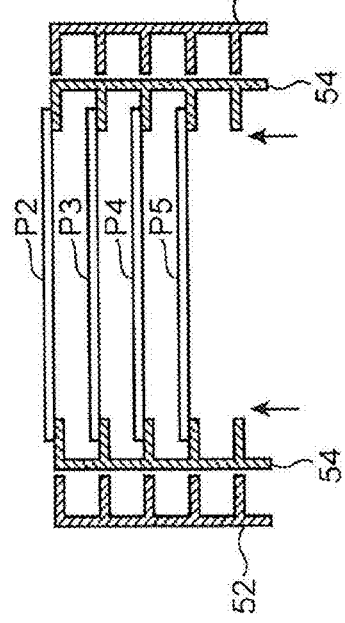

Subsequently, after the respective first pallet support members 52 move the separated position and the second pallet support members 54 move from the lowering position to the moved up position in the foregoing state, the respective first pallet support members 52 move from the separated position to the approaching position (FIG. 14B to FIG. 14D). The position of the guide grooves 531 of the first pallet support members 52 supporting the pallets P is displaced upward by one level and, consequently, the position of the respective pallets P2 to P4 supported by the parts feeding table 15A is moved up by one level. In this state, the original topmost pallet P1 is moved to the bottommost level (bottommost position) from the relay device 16 (shown with a dashed-two dotted line in FIG. 14D).

Note that, in the elevating operation of the pallets P of the parts feeding table 15A explained above, the operation shown in FIG. 13A corresponds to the "pallet retrieval step" of the present invention, and the operation shown in FIG. 13B to FIG. 13D and FIG. 14A to FIG. 14D corresponds to the "first pallet moving step" of the present invention.

With the foregoing parts feeding table 15A also, as with the type shown in FIG. 5, it is possible to stock a plurality of (five) pallets P in a plurality of vertical levels, and the respective pallets P can be moved in the vertical direction without having to use the relay device 16. Accordingly, according to the parts feeding device 10 equipped with this kind of parts feeding table 15A, as with the parts feeding table 15 shown in FIG. 5, parts can be fed efficiently to the parts mounting device 1.

Note that, in the examples of FIG. 13A to FIG. 13D, FIG. 14A to FIG. 14D, explained was a case where, when parts are retrieved from the tray on the pallet P positioned at the topmost level, the topmost pallet P is retrieved onto the relay device 16, the other pallets P are moved up one level each, and the original topmost pallet P is moved to the bottommost level. Nevertheless, the opposite; that is, it is also possible to feed the parts while lowering (moving down) the pallets P (corresponds to the "second pallet moving step" of the present invention).

In the foregoing case, foremost, in the state shown in FIG. 13A, the pallet P of the bottommost level (bottommost position) is retrieved by the relay device 16 during the retrieval of parts from the topmost pallet P by the head unit 5, and the relay device 16 is caused to stand by in a state where the pallet P is moved to the topmost height position. In addition, after the retrieval of parts from the topmost pallet P is completed, the respective first pallet support members 52 are moved to the separated position, and the respective second pallet support members 54 are moved to the lowering position, the respective first pallet support members 52 are thereafter reset to the approaching position. Subsequently, in a state where the respective first pallet support members 52 are supporting the plurality of pallets P, the respective second pallet support members 54 are moved from the approaching position to the separated position, and the respective second pallet support members 54 are disposed at the outer side of the plurality of pallets P. In addition, after moving the respective second pallet support members 54 from the lowering position to the moved up position in a state of being in the separated position, the second pallet support members 54 are reset from the separated position to the approaching position. Subsequently, the pallet P that was initially retrieved from the bottommost level is moved to the topmost level (topmost position).

Figure 15:
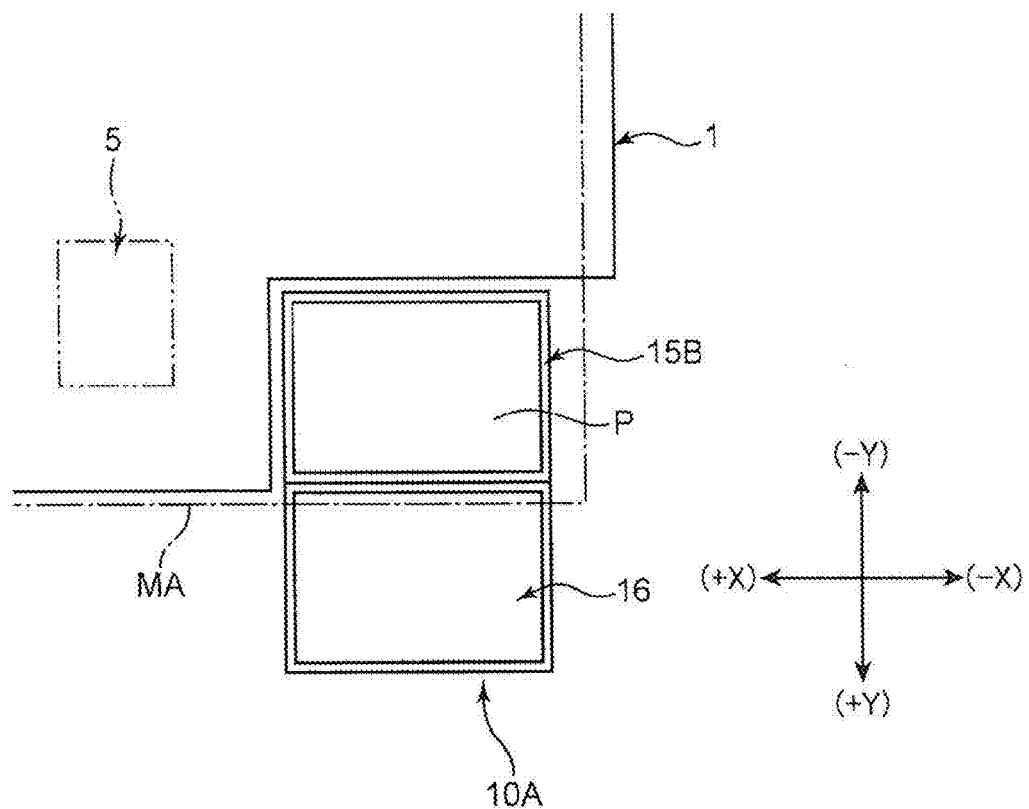
FIG. 15 is a planar schematic diagram showing the parts feeding device according to the present invention, and another embodiment of the parts mounting device (parts mounting device of the present invention) equipped with the parts feeding device.

Another embodiment of the parts feeding device of the present invention is now explained with reference to FIG. 15.

The parts feeding device 10A shown in the diagram comprises, as with the type shown in FIG. 1, a parts feeding table 15B, a relay device 16, an elevation drive mechanism of the relay device 16, a frame for supporting the foregoing components, and so on. However, the parts feeding device 10A does not comprise the magazine 14 shown in FIG. 1, and the parts feeding table 15B doubles as the magazine. Moreover, the parts feeding device 10A does not comprise the tape feeding retaining portion 18 shown in FIG. 1.

The parts feeding device 10A is coupled to the front side (+Y direction side) of the parts mounting device 1, and, in this coupled state, the parts feeding table 15B is disposed within the movable range MA of the head unit (head 5a) in the XY direction. The parts feeding table 15B is configured the same as the parts feeding tables 15, 15A explained with reference to FIG. 5 or FIG. 11 and, therefore, the head unit 5 can adsorb parts from the pallet P (tray) that is supported by the topmost level of the stock portion Sp, in which the upside of the parts feeding table 15B is opened, pursuant to the elevation of the head 5a.

Figure 11:
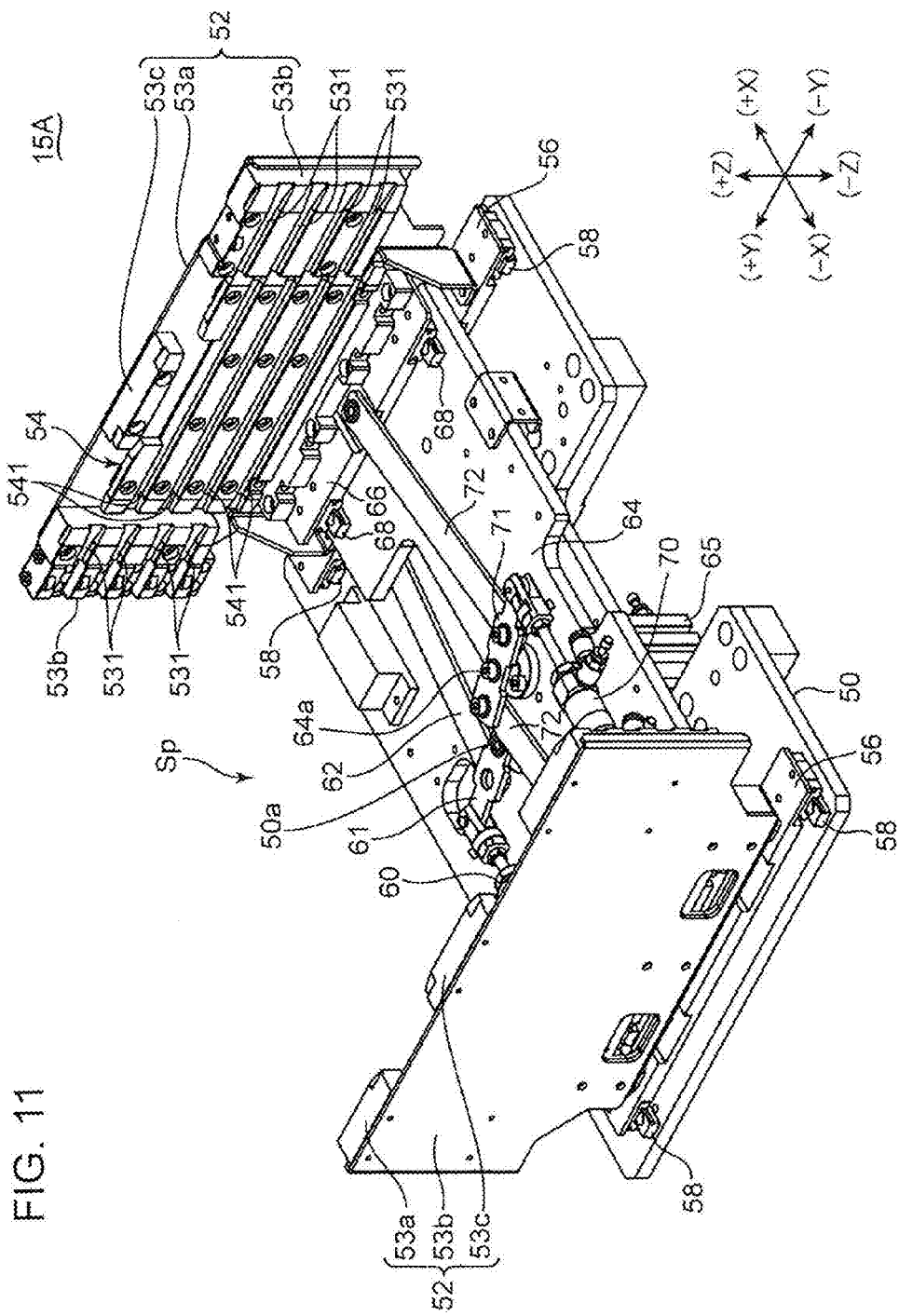
FIG. 11 is a perspective view showing another embodiment of the parts feeding table.

Note that, the parts feeding table 15B has more pallet supporting portions in comparison to the parts feeding table 15 shown in FIG. 5 or the parts feeding table 15A shown in FIG. 11, and, for example, the number of pallet supporting portions is set to 20 levels. However, the delivery of the pallets P between the parts feeding table 15B and the relay device 16 is performed in the same manner as the types shown in FIG. 1 and FIG. 5.

With this parts feeding device 10A, for example, after the retrieval of parts from the pallet P (tray) positioned at the topmost level (topmost position) of the parts feeding table 15B is completed, the topmost pallet P is retrieved onto the relay device 16 that was standing by at the topmost height position, and, after this retrieval, the other pallets P are synchronously moved up one level each immediately thereafter. Moreover, the original topmost pallet P on the relay device 16 is moved to the bottommost level of the parts feeding table 15B, and the empty relay device 16 is moved to the topmost height position and caused to stand by. By repeatedly performing this kind of operation (third pallet moving step), parts can be fed efficiently.

Otherwise, the pallet P of the bottommost level (bottommost position) is retrieved from the parts feeding table 15B to the relay device 16 before the retrieval of parts from the topmost pallet P (tray) is completed, the relay device 16 is moved upward, and the pallet P is caused to stand by at a height position corresponding to the topmost level. At the point in time that the retrieval of parts supported by the pallet P positioned at the topmost level is completed, the respective pallets P supported by the support members (threaded shafts 42 or the like) are synchronously lowered one level each, and the original bottommost pallet P is transferred from the relay device 16 to the topmost level of the parts feeding table 15B. By repeatedly performing this kind of operation (fourth pallet moving step), parts can be fed efficiently.

Note that, while no reference was made in the explanation of the parts feeding devices 10, 10A, the pallet P (tray) is provided with a virtual or substantial identification symbol, and the control device of the parts feeding devices 10, 10A comprises a storage device for storing pallet positional information which associates the pallet supporting portions in the parts feeding tables 15, 15A, 15B, the respective housing levels of the magazine 14 and the relay device 16 with an identification symbol of the pallets P supported thereby, and updating the pallet positional information pursuant to the movement of the pallets P. The control device additionally comprises a storage device for storing parts information such as the types of parts and number of parts housed in the pallet P (tray), and updating the parts information pursuant to the retrieval of parts by the head unit 5.

The parts feeding devices 10, 10A and the parts feeding method according to the present invention were explained above, but the foregoing parts feeding devices 10, 10A and the parts feeding method are exemplifications of the preferred embodiments of the parts feeding device and the parts feeding method according to the present invention, and the specific configuration and method thereof can be suitably modified to the extent that such modification will not deviate from the gist of this invention.

For example, in each of the foregoing embodiments, while the topmost pallet P is moved to the bottommost level or the bottommost pallet P is moved to the topmost level upon moving the pallets P of the parts feeding tables 15, 15A, 15B using the relay device 16, for example, it is also possible to retrieve the pallet P supported by a halfway level (pallet supporting portion other than the topmost level and bottommost level) onto the relay device 16 during the retrieval of parts from the topmost pallet P, and, in preparation for the subsequent disposal to the topmost level, the pallet P may be caused to stand by at a height position corresponding to the topmost level. Otherwise, after the retrieval of parts from the topmost pallet P, it is also possible to retrieve the topmost pallet P onto the relay device 16, moved up the other pallets P of the parts feeding tables 15, 15A, 15B, and thereafter house the pallets P retained by the relay device 16 in an empty pallet supporting portion among the pallet supporting portions of the parts feeding tables 15, 15A, 15B which is not housing any pallets P.

Moreover, for example, in cases where the highest height position of the relay device 16 capable of delivering the pallets P to the parts feeding tables 15, 15A, 15B is lower than the topmost height position of the parts feeding tables 15, 15A, 15B (when the upper limit of the movable range of the relay device 16 is lower than the topmost height position), the pallets P may be delivered between the parts feeding tables 15, 15A, 15B and the relay device 16 as follows.

For example, after lowering the topmost pallet P, from which the retrieval of parts by the head unit 5 is completed, one or a plurality of levels together with a lower pallet P, the original topmost pallet P is retrieved to the relay device 16 which was standing by at a predetermined height position in advance. Immediately thereafter, the pallets P remaining in the parts feeding tables 15, 15A, 15B are elevated to cause the topmost pallet P to be disposed at the topmost level, and the head unit 5 is caused to retrieve parts from the topmost pallet P (tray). Subsequently, during the retrieval of parts, the pallet P on the relay device 16 is replaced with a new pallet P, and, after the housing the pallet P in a predetermined pallet supporting portion of the parts feeding tables 15, 15A, 15B, the relay device 16 is caused to stand by at the predetermined height position.

Otherwise, after lowering the topmost pallet P, from which the retrieval of parts by the head unit 5 is completed, a plurality of levels of two levels or more together with a lower pallet P, the subsequent pallet P is transferred to the pallet supporting portion from the relay device 16 that was caused to stand by at the predetermined height position in advance; specifically, from the relay device 16 that was caused to stand by at a height position of the pallet supporting portion among the pallet supporting portions to become empty due to the lowering described above, and, upon elevating the pallet P to the topmost level, the head unit 5 is caused to retrieve parts from the topmost pallet P (tray). Subsequently, during the retrieval of parts, the pallet P from which the retrieval of parts was previously performed (original pallet P that was positioned at the topmost level) is retrieved onto the relay device 16, this pallet P is replaced with a new pallet P, and the relay device 16 supporting the new pallet P is caused to stand by at the predetermined height position of the parts feeding tables 15, 15A, 15B.

According to the foregoing methods, in cases of delivering the topmost pallet P between the parts feeding tables 15, 15A, 15B and the relay device 16, the operation of moving two pallets P is required. Nevertheless, the replacement of the pallet P with the relay device 16 can be performed during the retrieval of parts from the topmost pallet P (tray) by the head unit 5 (head 5a). Thus, in comparison to a conventional parts feeding device, parts can be efficiently fed to the parts mounting device 1, and this is effective upon efficiently performing the mounting operation of the parts mounting device 1.

Moreover, in each of the foregoing embodiments, while the parts feeding devices 10, 10A are used in a state of being removably coupled to the parts mounting device 1 for the positioning thereof relative to the parts mounting device 1, so as long as the topmost pallet P of the parts feeding tables 15, 15A, 15B can be disposed to be positioned within the movable range of the head unit 5 (head 5a) in the XY direction, the parts feeding devices 10, 10A do not necessarily have to be used in a state of being coupled to the parts mounting device 1. In the foregoing case, by providing a plurality of reference position marks to the parts feeding tables 15, 15A, 15B or the pallet P (tray), and imaging the reference position marks with a substrate recognition camera or the like installed in the head unit 5, it is possible to detect the position of the parts feeding tables 15, 15A, 15B relative to the parts mounting device 1, and the positioning of the head unit (head 5a) in the XY direction may be performed based on the detection results upon retrieving parts from the pallet P (tray). According to the foregoing configuration, parts can be retrieved from the pallet P (tray) using the head unit 5 with a precision that is not inferior to the case of coupling the parts feeding devices 10, 10A to the parts mounting device 1.

The present invention explained above can be summarized as follows.

The parts feeding device according to one aspect of the present invention is a parts feeding device placed adjacent to a working device capable of retrieving parts housed in a tray using a head having a predetermined movable range, comprising a magazine which includes a plurality of pallets each having the tray mounted thereon, the pallets being housed in a state of being arranged in a vertical direction so as to be inserted and removed in a horizontal first direction, a parts feeding table which is placed opposite to the magazine in the first direction, and which can support the pallets that are pulled out from the magazine, and a relay device which is provided movably in a vertical direction at a position between the magazine and the parts feeding table, and which delivers the pallets in the first direction between the magazine and the parts feeding table, wherein the parts feeding table supports the pallets in a state where the plurality of pallets are arranged in the vertical direction, and in a state where a tray mounted on a topmost pallet, among the plurality of pallets, is positioned within the movable range of the head and an upside of the tray is open.

With this parts feeding device, the relay device moves in a vertical direction relative to the magazine and the parts feeding table, and retrieves the pallet of an arbitrary position housed in the magazine, and transfers that pallet to the parts feeding table. In the foregoing case, since the parts feeding table can stock a plurality of pallets as described above, the relay device can proceed to the retrieval operation of the subsequent pallet (subsequent parts) (operation of retrieving the pallet from the magazine) while leaving the preceding pallet (preceding parts) on the table. In other words, while retrieving parts from the topmost pallet (tray) of the parts feeding table (support member), for instance, it is possible to prepare the subsequent pallet and cause it to stand by at a position corresponding to the topmost level. Thus, after the parts are retrieved using the head, the subsequent pallet can be quickly disposed at the topmost level of the parts feeding table, and the retrieval of parts from that pallet (tray) can be performed. It is thereby possible to feed the subsequent parts in a short pitch (time). Moreover, in cases where different types of parts are to be continuously fed, by preparing the plurality of pallets housing the parts (tray) on the parts feeding table in advance and switching the position of the pallets on the parts feeding table using the relay device, the plurality of types of parts can be fed without having to insert and remove the pallet into and from the magazine each time. Thus, the parts can be fed in a shorter pitch (time).

Note that, preferably, the parts feeding table includes a support member having pallet supporting portions of a plurality of levels for supporting the plurality of pallets, and an elevating mechanism for synchronously moving, in the vertical direction, the plurality of pallets supported by the support member in a state where a positional relation of the plurality of pallets is maintained.

As described above, according to a configuration in which the parts feeding table itself moves the pallets, for example, by retrieving the topmost pallet supported by the table using the relay device, the pallet therebeneath can be automatically moved up and parts can be retrieved from the tray on that pallet. Thus, the parts can be fed in a shorter pitch (time).

As a specific configuration in the foregoing case, preferably, the support member is a plurality of threaded shafts extending parallel to each other in a vertical direction, and a thread groove of each threaded shaft is used as the pallet supporting portion, the pallets each include a flange portion that can be inserted into the thread groove, and are each supported by the threaded shaft with the flange portion, and the elevating mechanism includes a first supporting portion for supporting each of the threaded shafts such that the threaded shaft can rotate around its axis, and a rotational drive mechanism for synchronously rotating each of the threaded shafts in a same direction, and the elevating mechanism moves the pallets in the vertical direction along the thread grooves based on a rotational drive of each of the threaded shafts.

According to the foregoing configuration, the respective pallets can be synchronously, smoothly and quickly moved in a vertical direction, with an extremely simple configuration, without requiring the movement of the support member supporting the pallet in the vertical direction.

Note that, as another specific configuration, preferably, the parts feeding table includes a pair of the support members arranged in a horizontal second direction which is orthogonal to the first direction, and supporting the pallets from an outer side of the second direction, and the elevating mechanism includes a second supporting portion for supporting the pair of support members such that the support members can be positioned at an approaching position capable of supporting the pallets and a separated position allowing the pallets to move in the vertical direction, a support member drive mechanism for moving the pair of support members to the approaching position and the separated position, and a transport mechanism for collectively retaining the pallets that are supported by the pair of support members and for moving the pallets in the vertical direction, and the elevating mechanism disposes the pair of support members at the separated position in a state of the pallets being retained by the transport mechanism, causes the transport mechanism to move the pallets in the vertical direction in this state, and thereafter moves the pair of support members to the approaching position, so as to move the pallets in the vertical direction.

With the foregoing configuration also, the plurality of pallets supported by the parts feeding table can be synchronously moved in the vertical direction.

Moreover, in each of the parts feeding devices, preferably, the relay device includes a guiding portion for guiding the pallets in the first direction, and an insertion/removal head which is provided movably in the first direction and which includes an engaging portion that can be displaced to a position capable of engaging with the pallets and a position of retracting below the pallets, the pallets each include, as engaged portions of the insertion/removal head, a first engaged portion provided to one end of the pallet in the first direction and a second engaged portion provided to another end, and the relay device inserts and removes the pallets into and from the magazine by moving the insertion/removal head in the first direction in a state where the engaging portion is engaged with the first engaged portion, and inserts and removes the pallets into and from the parts feeding table by moving the insertion/removal head in the first direction in a state where the engaging portion is engaged with the second engaged portion.

According to the foregoing configuration, the insertion and removal of the pallets into and from the magazine and the insertion and removal of the pallets into and from the parts feeding table can be smoothly performed pursuant to the movement of the insertion/removal head of the relay device.

In the foregoing case, preferably, the insertion/removal head includes a first insertion/removal head for inserting and removing the pallets into and from the magazine in a state where the engaging portion is engaged with the first engaged portion, and a second insertion/removal head for inserting and removing the pallets into and from the parts feeding table in a state where the engaging portion is engaged with the second engaged portion.

With the foregoing configuration, upon transferring the pallets from the magazine onto the parts feeding table, after the pallet is pulled out from the magazine to the relay device by the first insertion/removal head, the second insertion/removal head pushes the retrieved pallet into the table from the relay device. Contrarily, upon returning the pallet from the parts feeding table to the magazine, after the second insertion/removal head retrieves the pallet from the table to the relay device, the first insertion/removal head pushes the retrieved pallet into the magazine from the relay device. As a result of the first insertion/removal head and the second insertion/removal head moving the pallets in coordination as described above, the insertion and removal of the pallets into and from the magazine and the parts feeding table can be performed smoothly and quickly.

Moreover, the parts feeding device according to another aspect of the present invention is a parts feeding device placed adjacent to a working device for retrieving parts housed in a tray using a head having a predetermined movable range, comprising a parts feeding table including a support member having pallet supporting portions of a plurality of levels capable of supporting a plurality of pallets, each having the tray mounted thereon, in a state where the plurality of pallets are arranged in a vertical direction, and in a state where a tray mounted on a topmost pallet, among the plurality of pallets, is positioned within the movable range of the head and an upside of the tray is open, and an elevating mechanism for at least moving the pallets supported by a topmost level of the support member to a lower level or moving the pallets supported by a lower level of the support member to the topmost level, and a relay device which is provided movably in a vertical direction at a position adjacent to the parts feeding table, and which inserts and removes the pallets into and from the pallet supporting portions of the parts feeding table.

According to the foregoing configuration, while parts are being retrieved from the topmost pallet (tray) using the head, it is possible to cause the subsequent pallet to stand by at a position corresponding to the topmost level of the parts feeding table (support member), retrieve the parts using the head, and thereafter quickly dispose the subsequent pallet at the topmost level of the parts feeding table. Thus, the subsequent parts can be fed in a short pitch (time). Moreover, in cases where different types of parts are to be continuously fed, by preparing the plurality of pallets housing the parts (tray) on the parts feeding table in advance and switching the position of the pallets on the parts feeding table using the relay device, the plurality of different types of parts can be fed. Thus, the parts can be fed in a shorter pitch (time).

Moreover, the parts mounting device according to one aspect of the present invention is a parts mounting device, comprising a head which has a predetermined movable range, retrieves parts housed in a tray and mounts the parts on a substrate, and any one of the parts feeding devices described above, wherein the parts feeding device is disposed such that the tray, which is mounted on the pallet positioned at a topmost level of the parts feeding table, is positioned within the movable range of the head.

According to the foregoing configuration, the head can receive the feed of parts in a shorter pitch (time), and the mounting efficiently will consequently increase.

Meanwhile, the parts feeding method according to one aspect of the present invention is a parts feeding method using the parts feeding device described above, comprising a pallet retrieval step of sequentially retrieving a plurality of pallets, each having the tray mounted thereon, from the magazine using the relay device, and causing a support member of the parts feeding table to support the plurality of pallets, and a first pallet moving step of retrieving, after parts are retrieved from the tray of the topmost pallet supported by the support member, the topmost pallet from the support member using the relay device, moving the other pallets to an upper level, one level at a time, using the elevating mechanism, and thereafter moving the original topmost pallet to a bottommost position using the relay device, or a second pallet moving step of retrieving, after parts are retrieved from the tray of the topmost pallet, a bottommost pallet from the support member using the relay device, moving the other pallets to a lower level, one level at a time, using the elevating mechanism, and thereafter moving the original bottommost pallet to a topmost position using the relay device.

According to the foregoing method, parts can be fed without having to insert and remove the pallet into and from the magazine each time. Thus, for instance, in cases of continuously feeding a plurality of different types of parts, the parts can be fed in a shorter pitch (time).

In the foregoing case, preferably, among pallet supporting portions of a plurality of levels of the support member, the pallet supporting portion of a topmost level is caused to support the topmost pallet, and, in the first pallet moving step, by retrieving the topmost pallet from the pallet supporting portion of the topmost level and moving the other pallets to an upper level, one level at a time, a topmost pallet among the other pallets is moved to the pallet supporting portion of the topmost level, and, in the second pallet moving step, the original bottommost pallet is moved to the pallet supporting portion of the topmost level.

According to the foregoing method, since the subsequent pallet (tray) from which the parts are to be retrieved can be disposed at the topmost level in a short time, the parts can be fed in a short pitch (time).

Moreover, with the parts feeding method according to the one aspect described above, preferably, among pallet supporting portions of a plurality of levels of the support member, the pallet supporting portion of a topmost level is caused to support the topmost pallet, and, in the first pallet moving step, by moving the topmost pallet to a pallet supporting portion that is lower than the pallet supporting portion of the topmost level using the elevating mechanism, retrieving the topmost pallet from the lower pallet supporting portion using the relay device, and thereafter moving the other pallets to an upper level, one level at a time, using the elevating mechanism, the pallet supporting portion of the topmost level is caused to support a topmost pallet among the other pallets, and, in the second pallet moving step, by retrieving the bottommost pallet from the support member using the relay device, moving the other pallets to a lower level using the elevating mechanism so that the topmost pallet among the other pallets is positioned at a level which is a plurality of levels lower from the pallet supporting portion of the topmost level, moving the original bottommost pallet to the support member using the relay device so that the pallet is positioned at the topmost level, and thereafter moving the pallets supported by the support member to an upper level, one level at a time, using the elevating mechanism, the original bottommost pallet is moved to the pallet supporting portion of the topmost level.

According to the foregoing method, even in cases where there is a limitation in the vertical movable range (topmost position) of the relay device, it is possible to dispose the subsequent pallet (tray) from which the parts are to be retrieved at the topmost level in a short time and, therefore, the parts can be fed in a short pitch (time).

Note that, with the parts feeding method described above, by repeatedly performing the first pallet moving step or the second pallet moving step, parts may be repeatedly retrieved in a predetermined order from the trays of the plurality of pallets supported by the support member of the parts feeding table.

According to the foregoing method, in cases where it is necessary to consider a plurality of different types of parts as one set, and repeatedly feed the set of parts, the parts can be fed efficiently.

This application is based on Japanese Patent application No. 2012-113461 filed in Japan Patent Office on May 17, 2012, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A parts feeding device placed adjacent to a working device capable of retrieving parts housed in a tray using a head having a predetermined movable range, comprising:
    a magazine which includes a plurality of pallets each having the tray mounted thereon, the pallets being housed in a state of being arranged in a vertical direction so as to be inserted and removed in a horizontal first direction;
    a parts feeding table which is placed opposite to the magazine in the first direction, and which can support the pallets that are pulled out from the magazine; and
    a relay device which is provided movably in a vertical direction at a position between the magazine and the parts feeding table, and which delivers the pallets in the first direction between the magazine and the parts feeding table,
    wherein the parts feeding table includes a support member having a plurality of pallet supporting portions at a plurality of levels for supporting the pallets in a state where the plurality of pallets are arranged in the vertical direction, and in a state where a tray mounted on a topmost pallet, among the plurality of pallets, is positioned within the movable range of the head and an upside of the tray is open,
    the relay device includes:
        a guide portion for guiding each pallet in the first direction;
        a first insertion/removal head and a second insertion/removal head respectively movable in the first direction, each of the first and second insertion/removal heads having an engaging portion shiftable between an actuated position of engaging with the pallet and a retracted position below the pallet;
        an engaging portion drive mechanism for displacing the engaging portion between the actuated position and the retracted position; and
        an insertion/removal head drive mechanism for associatedly moving the first insertion/removal head and the second insertion/removal head in opposite directions, the insertion/removal head drive mechanism includes:
        a rail for movably supporting the first insertion/removal head and the second insertion/removal head in the first direction;
        a pair of pulleys arranged away from each other in the first direction;
        a motor for rotatably driving one of the pair of pulleys; and
        an endless drive belt placed across the pair of pulleys, and coupled to the first insertion/removal head and the second insertion/removal head on the opposite sides of a center line connecting the centers of the pair of pulleys, and
    the pallet includes a first engaged portion at a front end of the pallet and a second engaged portion at a rear end of the pallet in a pulling-out direction from the magazine, the first and the second engaged portions being for the first and second insertion/removal heads, the parts feeding device further comprising:

a control device which executes controls of:
- controlling the engaging portion drive mechanism and the insertion/removal head drive mechanism;
- inserting and removing the pallet into and from the magazine by moving the first insertion/removal head in the first direction in a state where the first insertion/removal head is engaged with the first engaged portion; and
- inserting and removing the pallet into and from the parts feeing table by moving the second insertion/removal head in the first direction in a state where the second insertion/removal head is engaged with the second engaged portion.

2. The parts feeding device according to claim 1, wherein the parts feeding table further includes an elevating mechanism for synchronously moving, in the vertical direction, the plurality of pallets supported by the support member in a state where a positional relation of the plurality of pallets is maintained.

3. The parts feeding device according to claim 2, wherein the support member is a plurality of threaded shafts extending parallel to each other in a vertical direction, and a thread groove of each threaded shaft is used as the pallet supporting portion, the pallets each include a flange portion that can be inserted into the thread groove, and are each supported by the threaded shaft with the flange portion, and the elevating mechanism includes a first supporting portion for supporting each of the threaded shafts such that the threaded shaft can rotate around its axis, and a rotational drive mechanism for synchronously rotating each of the threaded shafts in a same direction, and the elevating mechanism moves the pallets in the vertical direction along the thread grooves based on a rotational drive of each of the threaded shafts.

4. The parts feeding device according to claim 2, wherein the parts feeding table includes a pair of the support members arranged in a horizontal second direction which is orthogonal to the first direction, and supporting the pallets from an outer side of the second direction, and wherein the elevating mechanism includes a second supporting portion for supporting the pair of support members such that the support members can be positioned at an approaching position capable of supporting the pallets and a separated position allowing the pallets to move in the vertical direction, a support member drive mechanism for moving the pair of support members to the approaching position and the separated position, and a transport mechanism for collectively retaining the pallets that are supported by the pair of support members and for moving the pallets in the vertical direction, and the elevating mechanism disposes the pair of support members at the separated position in a state of the pallets being retained by the transport mechanism, causes the transport mechanism to move the pallets in the vertical direction in this state, and thereafter moves the pair of support members to the approaching position, so as to move the pallets in the vertical direction.

5. A parts mounting device, comprising:

a head which has a predetermined movable range, retrieves parts housed in a tray and mounts the parts on a substrate; and the parts feeding device according to claim 1, wherein the parts feeding device is disposed such that the tray, which is mounted on the pallet positioned at a topmost level of the parts feeding table, is positioned within the movable range of the head.

6. A parts feeding method using a parts feeding device including:

a magazine which includes a plurality of pallets each having a tray mounted thereon for housing parts, the pallets being housed in a state of being arranged in a vertical direction so as to be inserted and removed in a horizontal first direction;

a parts feeding table which is placed opposite to the magazine in the first direction, and includes a support member having a plurality of pallet supporting portions at a plurality of levels for supporting the plurality of pallets, and an elevating mechanism for synchronously moving, in the vertical direction, the plurality of pallets supported by the support member in a state where a positional relation of the plurality of pallets is maintained, the parts feeding table being capable of supporting the pallets that are pulled out from the magazine; and a relay device which is provided movably in a vertical direction at a position between the magazine and the parts feeding table, and which delivers the pallets in the first direction between the magazine and the parts feeding table, wherein the parts feeding table supports the plurality of pallets in a state where the plurality of pallets are arranged in the vertical direction, and in a state where a tray mounted on a topmost pallet, among the plurality of pallets, is positioned within the movable range of the head and an upside of the tray is open, comprising:
- a pallet retrieval step of sequentially retrieving the plurality of pallets, each having the tray mounted thereon, from the magazine using the relay device, and causing the support member of the parts feeding table to support the plurality of pallets; and
- a first pallet moving step of retrieving, after parts are retrieved from the tray of the topmost pallet supported by the support member, the topmost pallet from the support member using the relay device, moving the other pallets to an upper level, one level at a time, using the elevating mechanism, and thereafter moving the original topmost pallet to a bottommost position using the relay device, or a second pallet moving step of retrieving, after parts are retrieved from the tray of the topmost pallet, a bottommost pallet from the support member using the relay device, moving the other pallets to a lower level, one level at a time, using the elevating mechanism, and thereafter moving the original bottommost pallet to a topmost position using the relay device.

7. The parts feeding method according to claim 6, wherein, among pallet supporting portions of a plurality of levels of the support member, the pallet supporting portion of a topmost level is caused to support the topmost pallet, in the first pallet moving step, by retrieving the topmost pallet from the pallet supporting portion of the topmost level and moving the other pallets to an upper level, one level at a time, a topmost pallet among the other pallets is moved to the pallet supporting portion of the topmost level, and in the second pallet moving step, the original bottommost pallet is moved to the pallet supporting portion of the topmost level.

8. The parts feeding method according to claim 6,
wherein, among pallet supporting portions of a plurality of levels of the support member, the pallet supporting portion of a topmost level is caused to support the topmost pallet,
in the first pallet moving step, by moving the topmost pallet to a pallet supporting portion that is lower than the pallet supporting portion of the topmost level using the elevating mechanism, retrieving the topmost pallet from the lower pallet supporting portion using the relay device, and thereafter moving the other pallets to an upper level, one level at a time, using the elevating mechanism, the pallet supporting portion of the topmost level is caused to support a topmost pallet among the other pallets, and
in the second pallet moving step, by retrieving the bottommost pallet from the support member using the relay device, moving the other pallets to a lower level using the elevating mechanism so that the topmost pallet among the other pallets is positioned at a level which is a plurality of levels lower from the pallet supporting portion of the topmost level, moving the original bottommost pallet to the support member using the relay device so that the pallet is positioned at the topmost level, and thereafter moving the pallets supported by the support member to an upper level, one level at a time, using the elevating mechanism, the original bottommost pallet is moved to the pallet supporting portion of the topmost level.

9. The parts feeding method according to claim ,
wherein, by repeatedly performing the first pallet moving step or the second pallet moving step, parts are repeatedly retrieved in a predetermined order from the trays of the plurality of pallets supported by the support member of the parts feeding table.

* * * * *